United States Patent
Manipatruni et al.

(10) Patent No.: US 11,056,593 B2
(45) Date of Patent: Jul. 6, 2021

(54) SEMICONDUCTOR DEVICES WITH METAL CONTACTS INCLUDING CRYSTALLINE ALLOYS

(71) Applicant: INTEL CORPORATION, Santa Clara, CA (US)

(72) Inventors: Sasikanth Manipatruni, Hillsboro, OR (US); Dmitri E. Nikonov, Beaverton, OR (US); Uygar E. Avci, Portland, OR (US); Christopher J. Wiegand, Portland, OR (US); Anurag Chaudhry, Sunnyvale, CA (US); Jasmeet S. Chawla, Beaverton, OR (US); Ian A Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/631,059

(22) PCT Filed: Sep. 12, 2017

(86) PCT No.: PCT/US2017/051190
§ 371 (c)(1),
(2) Date: Jan. 14, 2020

(87) PCT Pub. No.: WO2019/054989
PCT Pub. Date: Mar. 21, 2019

(65) Prior Publication Data
US 2020/0152781 A1    May 14, 2020

(51) Int. Cl.
*H01L 29/78* (2006.01)
*H01L 21/28* (2006.01)
(Continued)

(52) U.S. Cl.
CPC ...... *H01L 29/785* (2013.01); *H01L 21/28061* (2013.01); *H01L 21/28264* (2013.01);
(Continued)

(58) Field of Classification Search
CPC .................. H01L 29/785; H01L 29/7839
See application file for complete search history.

(56) References Cited

U.S. PATENT DOCUMENTS

| | | | |
|---|---|---|---|
| 8,575,653 B2 * | 11/2013 | Rachmady | H01L 21/30604 257/192 |
| 10,128,334 B1 * | 11/2018 | Bourjot | H01L 29/72 |

(Continued)

FOREIGN PATENT DOCUMENTS

| | | |
|---|---|---|
| EP | 2866232 | 4/2021 |
| KR | 20060114472 A | 11/2006 |

(Continued)

OTHER PUBLICATIONS

Bob Capudean, Metallurgy Matters: The structure of metal, Welder. (Year: 2003).*

(Continued)

*Primary Examiner* — Farun Lu
(74) *Attorney, Agent, or Firm* — Schwabe, Williamson & Wyatt, P.C.

(57) ABSTRACT

Techniques are disclosed for forming semiconductor integrated circuits including one or more of source and drain contacts and gate electrodes comprising crystalline alloys including a transition metal. The crystalline alloys help to reduce contact resistance to the semiconductor devices. In some embodiments of the present disclosure, this reduction in contact resistance is accomplished by aligning the work function of the crystalline alloy with the work function of the source and drain regions such that a Schottky barrier height associated with an interface between the crystalline alloys (Continued)

and the source and drain regions is in a range of 0.3 eV or less.

19 Claims, 15 Drawing Sheets

(51) Int. Cl.

| | |
|---|---|
| *H01L 29/08* | (2006.01) |
| *H01L 29/10* | (2006.01) |
| *H01L 29/417* | (2006.01) |
| *H01L 29/49* | (2006.01) |
| *H01L 29/51* | (2006.01) |
| *H01L 29/66* | (2006.01) |
| *H01L 29/18* | (2006.01) |
| *H01L 21/3105* | (2006.01) |
| *H01L 21/8252* | (2006.01) |

(52) U.S. Cl.
CPC ...... *H01L 29/0847* (2013.01); *H01L 29/1037* (2013.01); *H01L 29/18* (2013.01); *H01L 29/41791* (2013.01); *H01L 29/4966* (2013.01); *H01L 29/513* (2013.01); *H01L 29/517* (2013.01); *H01L 29/518* (2013.01); *H01L 29/66522* (2013.01); *H01L 29/66545* (2013.01); *H01L 29/66795* (2013.01); *H01L 29/7839* (2013.01); *H01L 21/31053* (2013.01); *H01L 21/8252* (2013.01)

(56) References Cited

U.S. PATENT DOCUMENTS

| | | |
|---|---|---|
| 2002/0003271 A1 | 1/2002 | Ikeda |
| 2011/0068326 A1 | 3/2011 | Jang et al. |
| 2015/0155365 A1 | 6/2015 | Lee |
| 2015/0171143 A1 | 6/2015 | Park |
| 2015/0262822 A1 | 9/2015 | Hung |
| 2015/0279663 A1 | 10/2015 | Harada |
| 2015/0311305 A1 | 10/2015 | Ishikawa et al. |
| 2017/0005197 A1* | 1/2017 | Xiao ............... H01L 29/4966 |

FOREIGN PATENT DOCUMENTS

| | | |
|---|---|---|
| WO | 2017111845 A1 | 6/2017 |
| WO | 2019054989 A1 | 3/2019 |

OTHER PUBLICATIONS

International Preliminary Report on Patentability received for PCT Application No. PCT/US2017/051190. dated Mar. 26, 2020. 10 pages.
International Search Report and Written Opinion received for PCT Application No. PCT/US2017/051190. dated Feb. 28, 2018. 13 pages.
Andrieu, et al., "Direct evidence for minority spin gap in the Co2MnSi Heusler compound," American Physical Society, Physical Review B93, 094417, (2016). pp. 094417-1-094417-7.
"Magnetism of Half-Metallic Heusler Compounds," Chapter 6. Retrieved from the Internet at: https://sundoc.bibliothek.uni-halle.de > diss-online; Jan. 23, 2017. 21 pages.
"Chapter 9 Metal-Semiconductor Contacts," Retrieved from the Internet at: https://studylib.net/doc/18196394/chapter-9-metal-semiconductor-contacts; May 19, 2017. 19 pages.
Chen, et al., "Uniaxial magnetic anisotropy of cobalt films deposited on sputtered MgO(001) substrates," American Physical Society, Physical Review B86, 064432, (2012). pp. 064432-1-064432-7.
"Electrical Characteristics of MOS Devices," Retrieved from the Internet at: https://www.google.com/search?client=firefox b-1-d&q-Electrical+Characteristics+of+MOS+Devices; May 19, 2017. 36 pages.
Graf, et al., "Heusler Compounds—A Material Class With Exceptional Properties," Advances in Magnetics, IEEE Transactions on Magnetics, vol. 47, No. 2, Feb. 2011. pp. 367-373.
Vakatani, T.M. and Rajanikanth, A., "Structure, magnetic property, and spin polarization of Co2FeAlxSi1-x Heusler alloys," Journal of Applied Physics 102, 033916 (2007). 8 pages.
Rata, et al., "Structural and magneto-transport characterization of Co2CrxFe1-xAl Heusler alloy films," Retrieved from the Internet at: arxiv.org/pdf/cond-mat/0603649. Published 2006. 11 pages.
Roy, Arunanshu Mohan, "Tunneling Contacts for Novel Semiconductor Devices," Dissertation Submitted to the Department of Electrical Engineering and the Committee on Graduate Studies of Stanford University. Jun. 2012. 140 pages.
Shigeta, et al., "Fabrication and Characterization of Epitaxial Films of Superconductor NbN and Highly Spin-Polarized Heusler Alloy Co2Fe0.4Mn0.6Si," Superconducting Spintronics, IEEE Magnetics Letters, vol. 8 (2017). 5 pages.
Takanashi, Koki, "CPP-GMR and Related Phenomena in Half-Metallic Heusler Alloy Systems," Tohoku University, Workshop on "Heusler Alloys for Spintronic Devices," Jul. 30, 2015. 17 pages.
Tobola, et al., "Crossover from semiconductor to magnetic metal in semi-Heusler phases as a function of valence electron concentration," J. Phys: Condons. Matter 19 (1998). pp. 1013-1032.
Wang, et al., "Highly conformal magnesium oxide thin films by low-temperature chemical vapor deposition from Mg(H3BNMe2BH3)2 and water," American Institute of Physics, Applied Physics Letters 102, 101605 (2013). pp. 101605-1-101605-4.
Zarei, et al., "Half-metallicity at the Hensler alloy Co2Cr0.5Fe0.5Al(001) surface and its interface with GaAs(001)," Journal of Physics: Condensed Matter. vol. 21 (2009). pp. 1-7.
"Ohmori K. et al: "Impact of additional factors in threshold voltage variability of metal/high-k gate stacks and its reduction by controlling crystalline structure and grain size in the metal gates", IEEE International Electron Devices Meeting, 2008: IEDM 2008; San Francisco, CA, USA, Dec. 15-17, 2008, IEEE, Piscataway, NJ, USA, Dec. 15, 2008 (Dec. 15, 2008), pp. 1-4, XP031434463, ISBN: 978-1-4244-2377-4".
Search Report for European Patent Application No. 17925316.6, dated Mar. 3, 2021, 10 pgs.

* cited by examiner

SEMICONDUCTOR DEVICES WITH METAL CONTACTS INCLUDING CRYSTALLINE ALLOYS

CROSS REFERENCE TO RELATED APPLICATIONS

This application is a U.S. national stage entry under 35 U.S.C. § 371(c) of International Application No. PCT/US17/51190, filed Sep. 12, 2017, the disclosure of which is incorporated by reference herein in its entirety.

BACKGROUND

Semiconductor devices are electronic components that exploit the electronic properties of semiconductor materials, such as silicon, germanium, and gallium arsenide. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate electrode and the channel region. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) to implement logic gates and other digital circuits.

A finFET is a MOSFET transistor built around a thin strip of semiconductor material (generally referred to as a fin). The conductive channel of the device effectively resides in the fin, adjacent the gate dielectric. Because the conductive channel of such configurations includes the three different, planar regions of the fin, such configurations have been termed as finFET and tri-gate transistors. Other types of finned configurations can also be used, such as so-called double-gate finFETs, in which the conductive channel principally includes only the two sidewalls of the fin (and not the top of the fin, for example). A gate-all-around (GAA) transistor (sometimes referred to as a nanowire or nanoribbon transistor) is configured similarly to a fin-based transistor, but instead of a finned channel region where the gate is on three portions (and thus, there are three effective gates), one or more nanowires/nanoribbons are used for the channel region and the gate material generally surrounds each nanowire/nanoribbon.

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of MOSFET devices, such as those used in a CMOS structure, it is often desired to increase movement of electrons in n-channel devices and holes in p-channel devices and contact regions. Such increased mobility can be achieved by reducing contact resistance. At the contact regions of the source and drain, a conductive material is deposited on the doped surface of the source/drain material, providing contacts. The interaction between the conductive material and the doped semiconductor surface produces a semiconductor junction. The resulting semiconductor junction is characterized by a Schottky barrier height between the conduction band and the Fermi level. Conduction of electrons through the Schottky barrier is limited by the barrier height and results in contact resistance.

Figure 1:
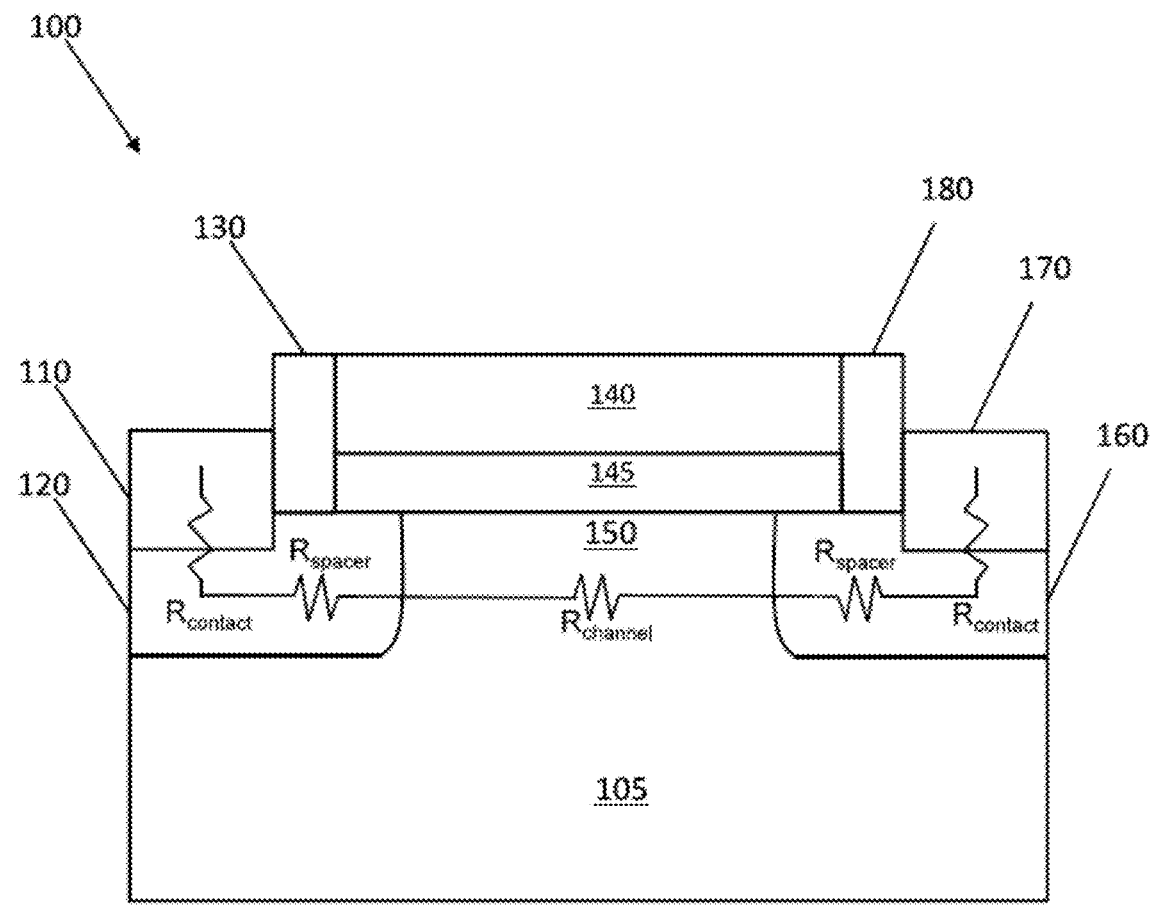
FIG. 1 is a diagram illustrating resistance components of a MOS device susceptible to high contact resistance.

The figures depict various embodiments of the present disclosure for purposes of illustration only. In the drawings, each identical or nearly identical component that is illustrated in various figures may be represented by a like numeral. For purposes of clarity, not every component may be labeled in every drawing. As will be appreciated, the figures are not necessarily drawn to scale or intended to limit the present disclosure to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures. Numerous variations, configurations, and other embodiments will be apparent from the following detailed discussion.

DETAILED DESCRIPTION

Techniques are disclosed for forming semiconductor integrated circuits including one or more of source and drain contacts and gate electrodes comprising crystalline alloys including a transition metal. The crystalline alloys help to reduce contact resistance to the semiconductor devices. In some embodiments of the present disclosure, this reduction in contact resistance is accomplished by aligning the work function of the crystalline alloy with the work function of the source and drain regions such that a Schottky barrier height associated with an interface between the crystalline alloys and the source and drain regions is in a range of 0.3 eV or less.

As will be further appreciated, the disclosed techniques may provide various advantages over standard MOSFETs, such as reduced contact resistance in scaled devices that may enable overall devices to run at increased efficiency with higher performance at lower voltages.

General Overview

As shown in FIG. 1, a MOS device, such as a PMOS or NMOS transistor 100 formed on a substrate 105 includes a source contact 110, a doped source region 120, a gate spacer 130 between the source contact 110 and gate stack (including gate dielectric 145 and electrode 140), a channel region 150 under the gate dielectric 145, a doped drain region 160, a drain contact 170, and a gate spacer 180 between the drain contact 170 and the gate stack. The overall resistance of the transistor 100 includes contributions from contact resistance, $R_{contact}$, spacer resistance, $R_{spacer}$, and channel resistance, $R_{channel}$. Source and drain contact resistance can significantly increase in scaled CMOS transistors as the dimensions of the source and drain contacts approach the electron mean free path. Increased contact resistance and increased access resistance $R_{ext}$ ($R_{ext}=R_{contact}+R_{spacer}$) can slow down the transistors and reduce their efficiency. Due to technology scaling that continues to reduce all dimensions of the device, as the length of the channel region continues to be reduced, the contribution of the channel resistance to the overall resistance decreases, and the contribution of the contact resistance is likely to rise as a percentage of the total device resistance, and may become larger than the channel resistance. Existing contact strategies to transistor devices, particularly III-V transistor devices, suffer from large Schottky barrier height to metal contact, in part due to Fermi level pinning, which in turn can lead to high contact resistance if not properly managed. Embodiments of the present disclosure recognize this problem and are configured to help to mitigate or otherwise reduce contact resistance, as will be appreciated.

Methodology and Architecture

Figure 2:
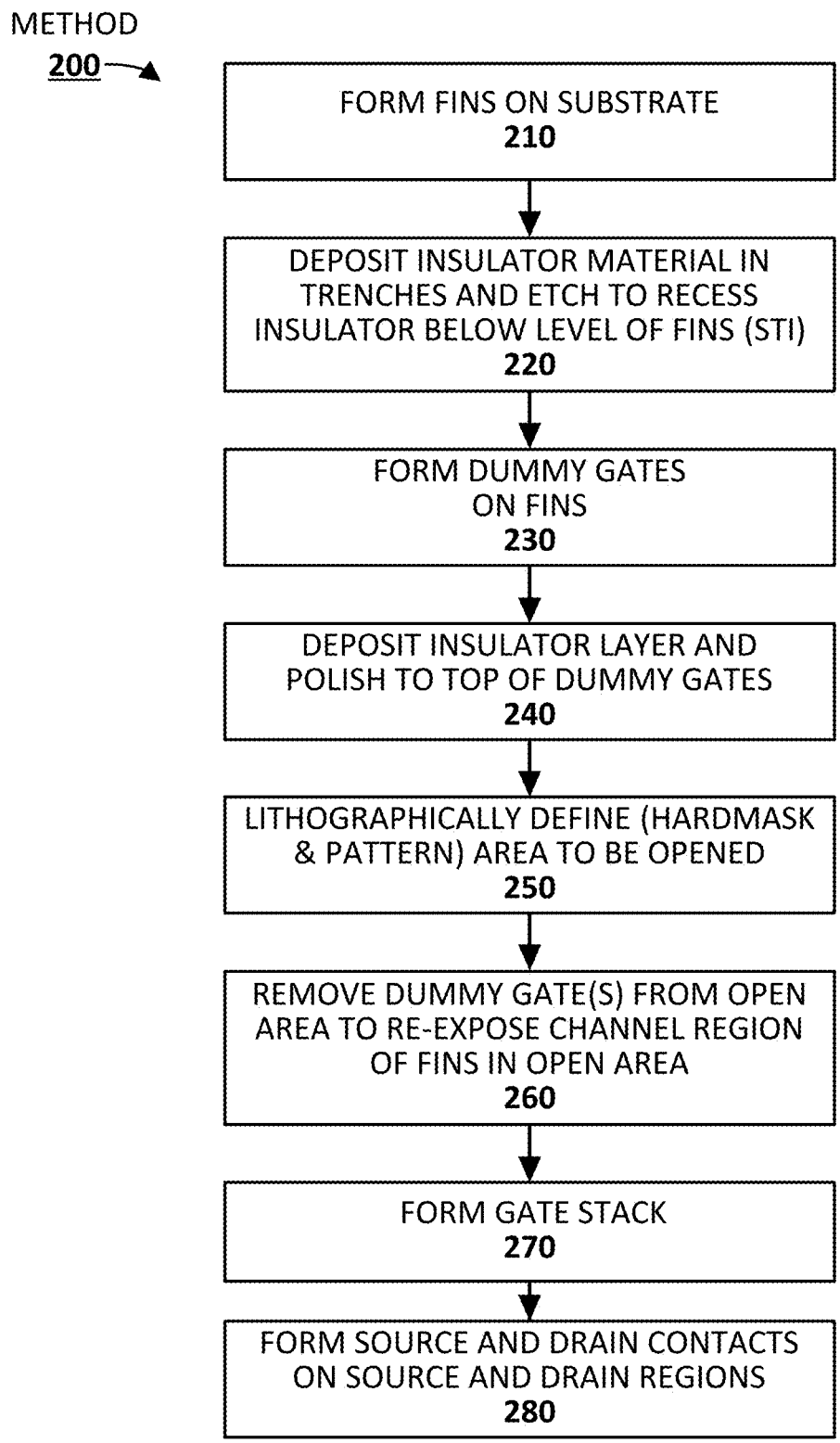
FIG. 2 shows a method of forming an integrated circuit structure including one or more of source and drain contacts and gate electrodes comprising crystalline alloys including a transition metal, in accordance with one or more embodiments of the present disclosure.

FIG. 2 shows a method 200 of forming an integrated circuit structure including one or more of source and drain contacts and gate electrodes comprising crystalline alloys including a transition metal, in accordance with one or more embodiments of the present disclosure. As will be apparent in light of this disclosure, forming the source and drain contacts is described herein in the context of a replacement metal gate (RMG) process. However, in some embodiments, forming the source and drain contacts may be performed before gate (or dummy gate) deposition, as will be discussed in more detail below. FIGS. 3A-3H illustrate example structures that are formed as the process flow or method 200 of FIG. 2 is carried out, in accordance with some embodiments. Although method 200 of FIG. 2 and the structures shown in FIGS. 3A-3H are depicted and described herein in the context of forming finned transistor configurations (e.g., tri-gate or finFET), similar principles and techniques as variously described herein may be used for other transistor configurations, including, for example, dual-gate, gate-all-around (e.g., nanowire/nanoribbon), planar, and other semiconductor device configurations, such as ferro-electric or magneto-electric devices, as will be apparent in light of this disclosure.

Figure 3A:
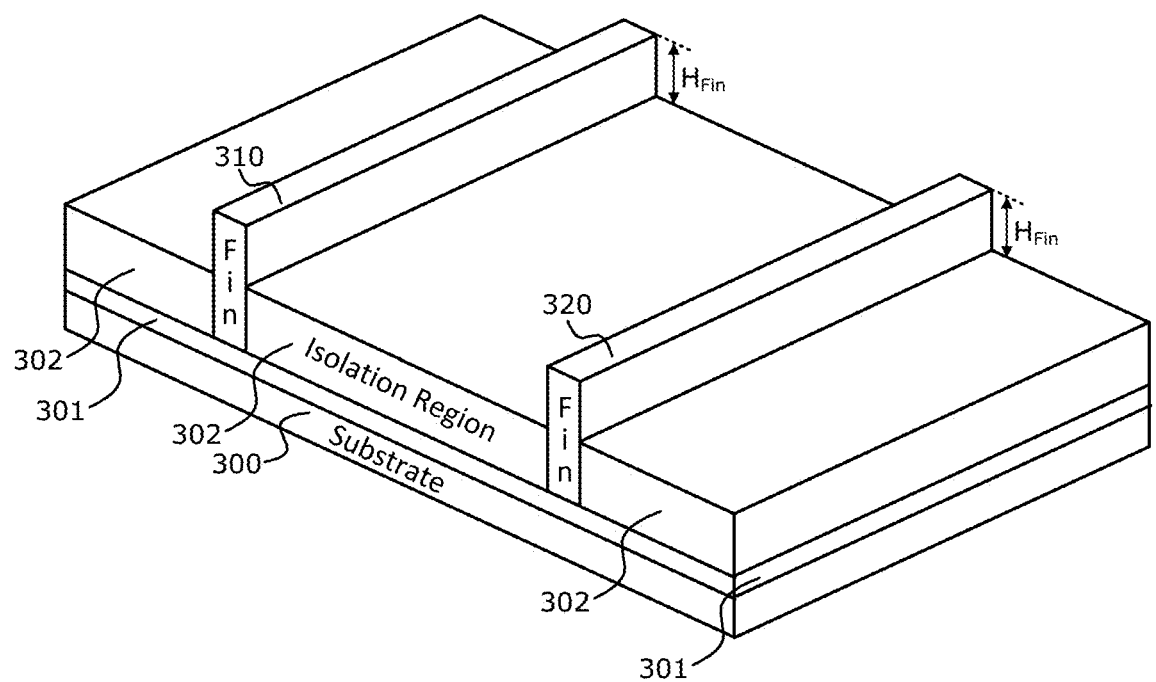
FIG. 3A illustrates a perspective view of a semiconductor substrate including fins after depositing trench isolation material in trenches and etching the trench isolation material to recess it below the level of the fins, in accordance with an embodiment.

FIG. 3A illustrates a perspective view of semiconductor substrate 300 including fins 310 and 320 after forming 210 fins 310 and 320 on barrier layer 301 and substrate 300, in accordance with an embodiment. Substrate 300 may be formed using various other suitable technologies for forming a silicon base or substrate, such as a silicon single crystal wafer. Substrate 300 may be implemented, for example, with a bulk silicon, a silicon-on-insulator configuration (SOI), or with multi-layered structures. In other implementations, substrate 300 may be formed using alternate materials, which may or may not be combined with silicon, such as germanium, silicon germanium, indium antimonide, lead telluride, indium arsenide, indium phosphide, indium gallium arsenide (e.g., $In_{0.7}Ga_{0.3}As$), gallium arsenide, or gallium antimonide, to name a few examples. In a more general sense, any material that may serve as a foundation upon which a semiconductor device may be built can be used in accordance with embodiments of the present disclosure. In some implementations, fins 310 and 320 may be formed on and from substrate 300, such that barrier layer 301 would not be present in such implementations.

The barrier layer 301 may be formed using various suitable materials for forming a barrier layer, such as indium-aluminum-arsenide (InAlAs) in the case of a III-V transistor (e.g., a GaAs or InGaAs transistor), to provide an example.

With further reference to FIG. 3A, fins 310 and 320 may be grown (e.g., epitaxially) from trenches formed in isolation material 302 after removal of sacrificial fins, the fins 310 and 320 being formed by deposition of desired semiconductor materials into trenches formed in isolation material 302. Some such aspect-ratio-trapping (ART) based fin forming techniques are provided in U.S. Patent Application Publication 2014/0027860. In some such ART-based cases, the replacement fin material can be provided in the context of multilayer stacks that include alternating layers of desired channel material and sacrificial/inactive material such as described in U.S. Patent Application Publication 2016/0260802. Such multilayer fins are particularly useful for gate-all-around transistors. In some ART-based cases, a first set of fins is formed with a first semiconductor material system (e.g., for p-type devices), and a second set of fins is formed with a second semiconductor material system (e.g., for n-type devices). Example fin materials include group IV semiconductor materials (e.g., silicon (Si), germanium (Ge)), and group III-V semiconductor materials, such as gallium-arsenide (GaAs), indium gallium arsenide (e.g., InGaAs), and XY alloys, where X can be gallium (Ga) or indium (In), and Y can be phosphorus (P), arsenic (As), or antimony (Sb). As can be understood based on this disclosure, a transistor formed from a given fin includes that fin material at least in the channel region of that transistor, such that the transistor may be a Si, SiGe, Ge, and/or III-V transistors. For instance, the techniques described herein may be used to form Ge NMOS, Ge, PMOS, SiGe NMOS, SiGe PMOS, GaAs NMOS, GaAs PMOS, InGaAs NMOS, InGaAs PMOS, and/or any other suitable transistor device as will be apparent in light of this disclosure. In some embodiments, the techniques may be used to benefit one or both of the NMOS and PMOS devices in a CMOS circuit. In a specific example embodiment, the substrate 300 is silicon, the barrier layer 301 is InAlAs, and the fin 310 and 320 material is InGaAs.

Generally, the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

As can be seen in FIG. 3A, fins 310 and 320 are depicted as rectangular in shape for ease of description. However, the fins as variously described herein need not be so limited. For example, in other embodiments, the fins formed at 210 may have a rounded top, a triangular or tapered shape, or some other suitable fin shape as will be apparent in light of this disclosure. As will also be apparent in light of this disclosure, fins 310 and 320 may be used for n-type MOS devices (NMOS), p-type MOS devices (PMOS), or a CMOS device (e.g., where fin 310 will be an n-type MOS and fin 320 will be a p-type MOS), for example. Also note that although only two fins 310 and 320 are shown for ease of description, it is contemplated that any number of similar fins and trenches may be formed on substrate 300 (e.g., hundreds of fins, thousands of fins, millions of fins, billions of fins, etc.) and benefit from the techniques described herein.

FIG. 3A further illustrates shallow trench isolation (STI), provided by isolation regions 302, after depositing 220 trench isolation material in the trenches and etching the trench isolation material to recess it below the level of fins 310 and 320, in accordance with an embodiment. Deposition 220 to form isolation regions 302 may include atomic layer deposition (ALD), chemical vapor deposition (CVD), spin-on deposition (SOD), high-density plasma (HDP), plasma enhanced chemical deposition (PECVD), and/or some other suitable technique. Isolation regions 302 may comprise, for example a dielectric, such as silicon dioxide ($SiO_2$). However, the isolation regions 302 may be any insulator, oxide, or inter-layer dielectric (ILD) material that provides the desired amount of electrical isolation for a given target application or end-use, as will be apparent in light of this disclosure. In cases where patterning hardmask was used to form fins 310 and 320, the hardmask can be removed prior to depositing the trench isolation material. In some cases, the trench isolation material may be polished flat to the level of the top of fins 310 and 320, prior to etching the material to recess it below the level of fins 310 and 320. As also shown in FIG. 3A, recessing the trench isolation material below the level of fins 310 and 320 creates a fin height, $H_{Fin}$, above the isolation regions 302. Non-planar semiconductor devices (e.g., FinFETs) have $H_{Fin}>0$, while planar semiconductor devices (e.g., transistors) have $H_{Fin}=0$.

Figure 3B:
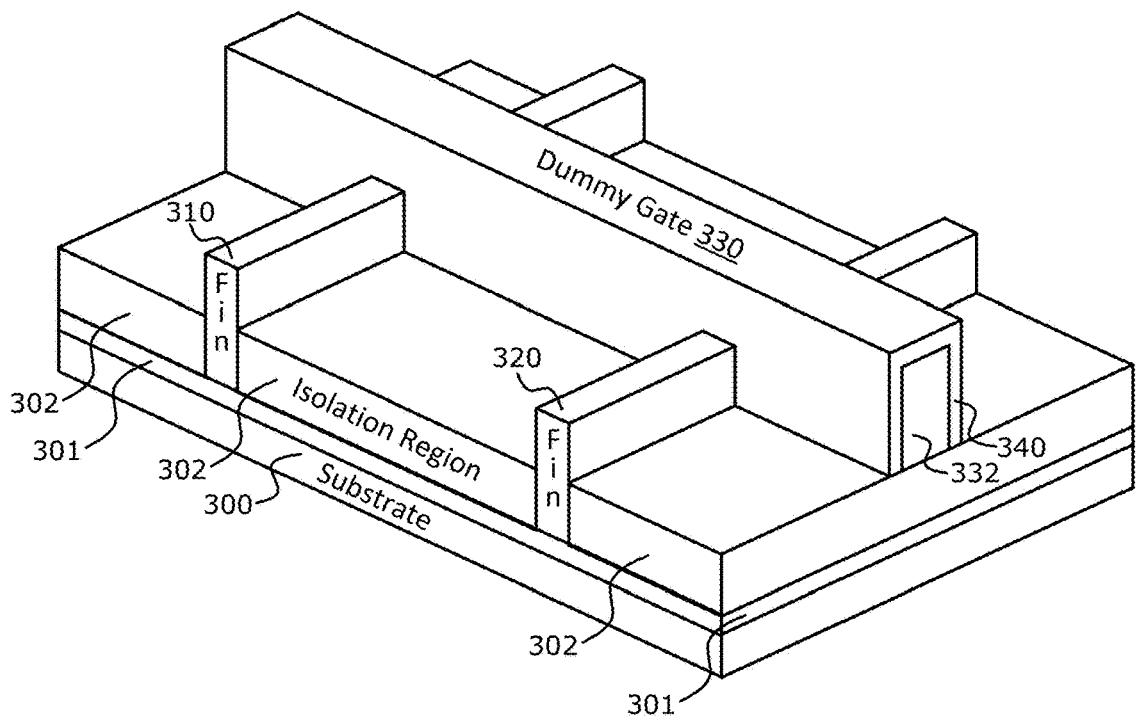
FIG. 3B illustrates a perspective view of the structure of FIG. 3A including a dummy gate after forming the same on the fins, in accordance with an embodiment.

FIG. 3B illustrates a perspective view of the structure of FIG. 3A including dummy gate 330 after forming 230 the same on fins 310 and 320, in accordance with an embodiment. As previously described, the techniques disclosed herein for forming transistors including source and drain contacts comprising crystalline alloys including a transition metal can be performed during the replacement gate process, which may also be known as a replacement metal gate (RMG) process. In this embodiment, dummy gate structure 330 can first be deposited by depositing a dummy gate dielectric/oxide (e.g., silicon dioxide) and dummy gate electrode 332 (e.g., dummy polysilicon). The resulting structure can be patterned and spacer material 340 can be deposited and etched to form the dummy gate structure shown in FIG. 3B. Such depositions, patterning, and etching can be done using any suitable techniques, as will be apparent in light of this disclosure. Note that dummy gate oxide is not shown, because it is under the dummy electrode/polysilicon layer 332, in this example embodiment. Also note that dummy gate structure 330 is indicated on top of spacer material 340 for ease of reference and that dummy gate structure 330 (which includes dummy gate oxide and dummy electrode/polysilicon layer 332) as referred to herein may or may not include spacer material 340 when being discussed. The spacer material 340 may be formed, for example, using standard gate spacer materials such as silicon dioxide, silicon nitride, or other suitable spacer materials. The width of the spacer material 340 may generally be chosen based on design requirements for the transistor being formed.

Figure 3C:
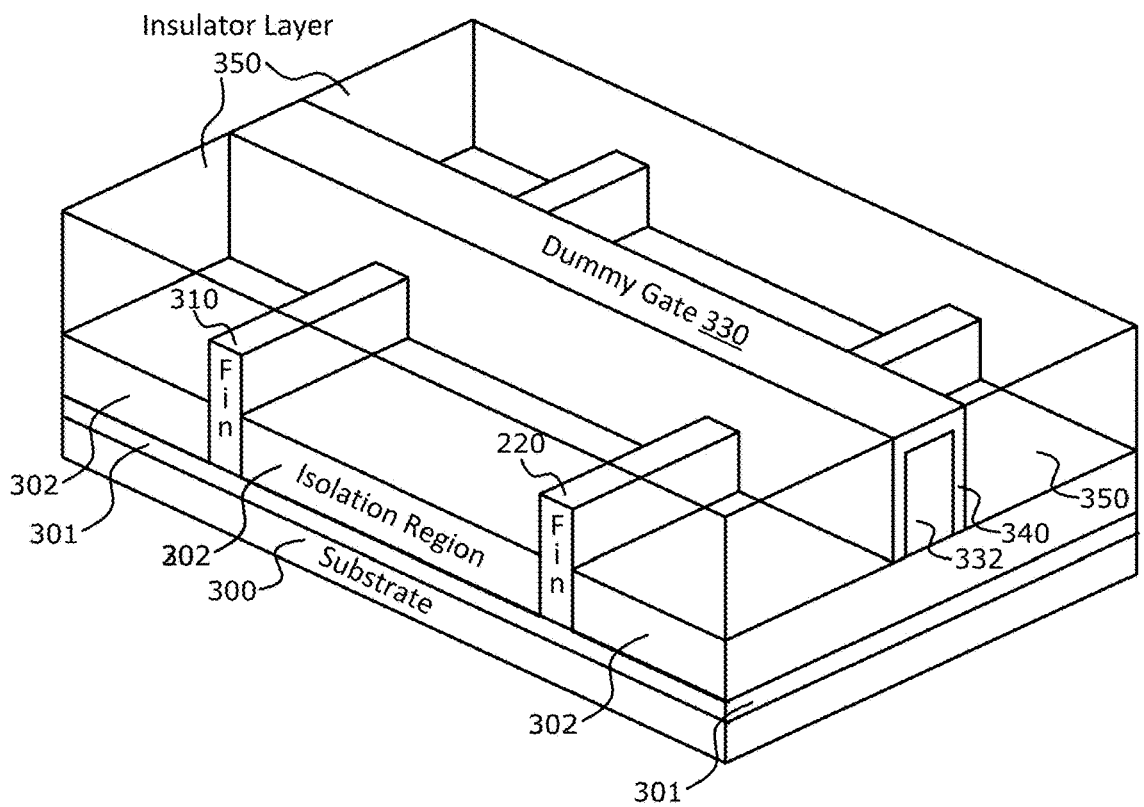
FIG. 3C illustrates a perspective view of the structure of FIG. 3B including an insulator layer after depositing the same and polishing the insulator layer to the top of the dummy gate, in accordance with an embodiment.

FIG. 3C illustrates a perspective view of the structure of FIG. 3B including insulator layer 350 after depositing 240 the same and polishing layer 350 to the top of dummy gate structure 330, in accordance with an embodiment. Insulator layer 350 may comprise any suitable filler material, including a dielectric material, such as oxides of silicon (e.g., $SiO_2$), doped oxides of silicon, fluorinated oxides of silicon, carbon doped oxides of silicon, various low-k dielectric materials (e.g., porous silicon dioxide), and combinations thereof, deposited by ALD, CVD, SOD, HDP, PECVD, and/or some other suitable technique, as will be apparent in light of this disclosure.

Figure 3D:
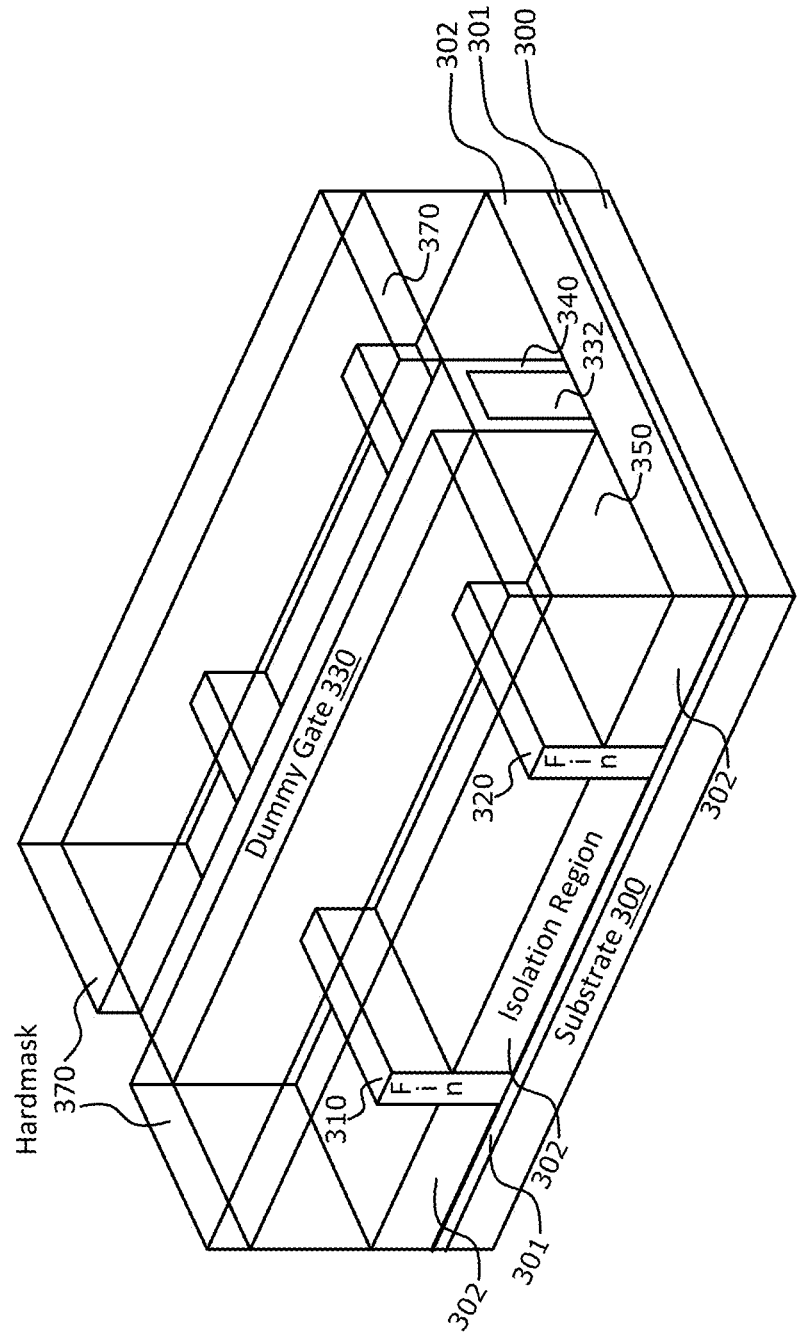
FIG. 3D illustrates a perspective view of the structure of FIG. 3C after lithographically defining an area to be opened over the dummy gate structure, in accordance with an embodiment.

FIG. 3D illustrates a perspective view of the structure of FIG. 3C after lithographically defining 250 an area to be opened over the dummy gate structure 330, in accordance with an embodiment. In this example embodiment, lithographically defining 250 the area to be opened includes a hardmasking and patterning process, resulting in the hardmask 370 pattern shown. Hardmask layer 370 can have any desired configuration and thickness, and in some instances, may be provided as a substantially conformal layer, or a multilayer structure. Hardmask layer 370 can be formed, for example, using CVD, SOD, and/or any other process suitable for providing a layer of hardmask material, as will be apparent in light of this disclosure. Also, in some embodiments, hardmask layer 370 can comprise, for example, a nitride, such as silicon nitride ($Si_3N_4$). However, hardmask layer 370 is not so limited in material composition, and in a more general sense, hardmask layer 370 may be any hardmask material configuration having sufficient resilience for a given target application or end-use, as will be apparent in light of this disclosure.

Figure 3E:
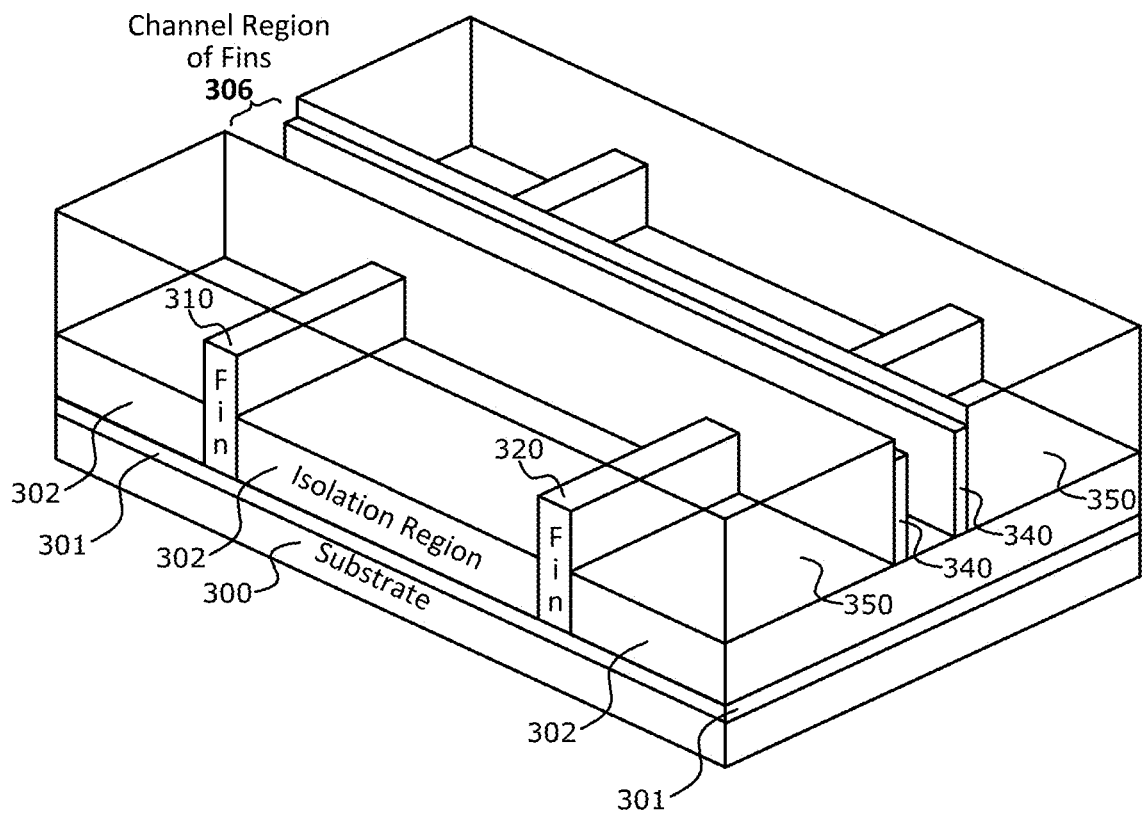
FIG. 3E illustrates a perspective view of the structure of FIG. 3D, after removing the dummy gate structure from the opened area to re-expose the channel region of the fins, in accordance with an embodiment.

FIG. 3E illustrates a perspective view of the structure of FIG. 3D, after removing 260 dummy gate structure 330 to re-expose the channel region 306 of fins 310 and 320 (or what may become the channel region once the device is fully fabricated), in accordance with an embodiment. Removing 260 dummy gate structure 330, may include removing any capping layer (e.g., formed by spacer material 340) on top of the dummy gate, and then removing dummy gate electrode/polysilicon 332 and dummy gate dielectric. Such removal may be done using any suitable etch, polish, and/or clean process, as will be apparent in light of this disclosure.

Figure 3F:
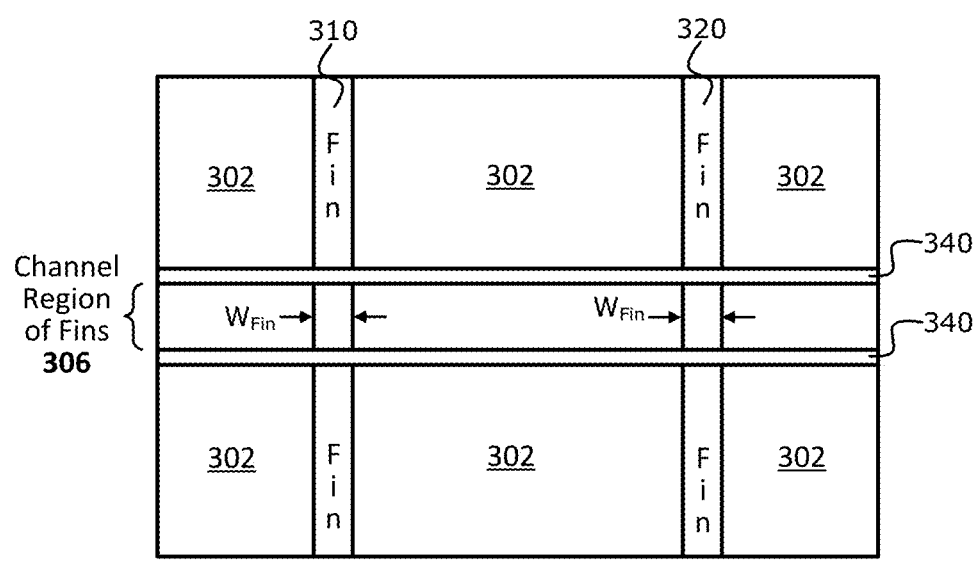
FIG. 3F illustrates a top planar view of the structure shown in FIG. 3E.

FIG. 3F illustrates a top planar view of the structure shown in FIG. 3E. As can be seen in this top planar view, channel region 306 of fins 310 and 320 has been re-exposed. As can also be seen, and as will be discussed in more detail below, fins 310 and 320 each have a width $W_{Fin}$. In some embodiments, $W_{Fin}$ can be in a range of between 1 nm and 30 nm, such as 7 nm, 10 nm, 15 nm, or 20 nm.

Figure 3G:
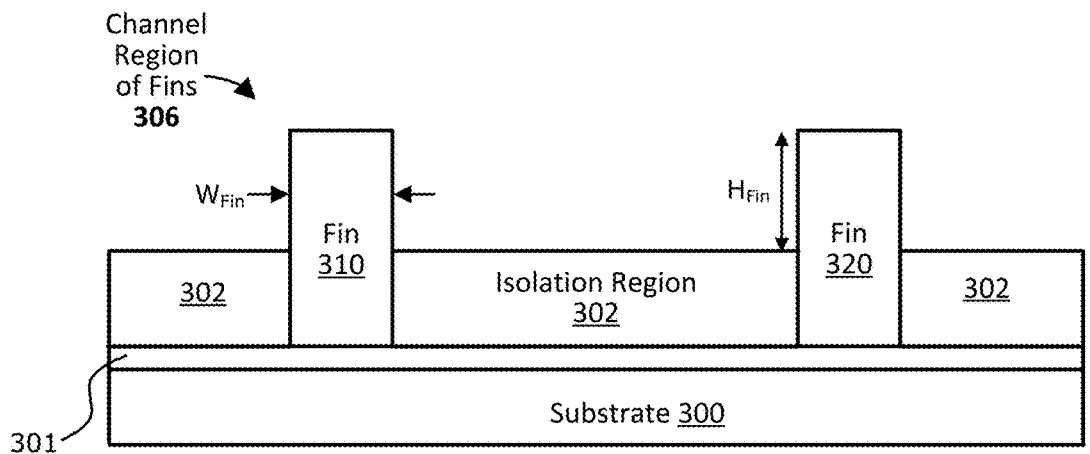
FIG. 3G illustrates a front cross-section view taken perpendicularly to the fins and through the channel region of the structure shown in FIG. 3F.

FIG. 3G illustrates a front planar view of only the channel region 306 of the structure shown in FIG. 3F. As can be seen in FIG. 3G, fins 310 and 320 each have a width $W_{Fin}$ and a height $H_{Fin}$. Although fins 310 and 320 need not have the same width $W_{Fin}$ and height $H_{Fin}$, they are the same in this embodiment for ease of description. In some embodiments, and as will be apparent in light of this disclosure, the width $W_{Fin}$ may be determined by trench etch 210, which was performed to form fins 310 and 320 on substrate 300. Note that the height $H_{Fin}$ as used herein is the distance from the top of isolation region 302 to the top of fins 310 and 320. In some embodiments, $H_{Fin}$ is in a range of between 20 nm and 75 nm, such as 25 nm, 30 nm, or 50 nm.

Figure 3H:
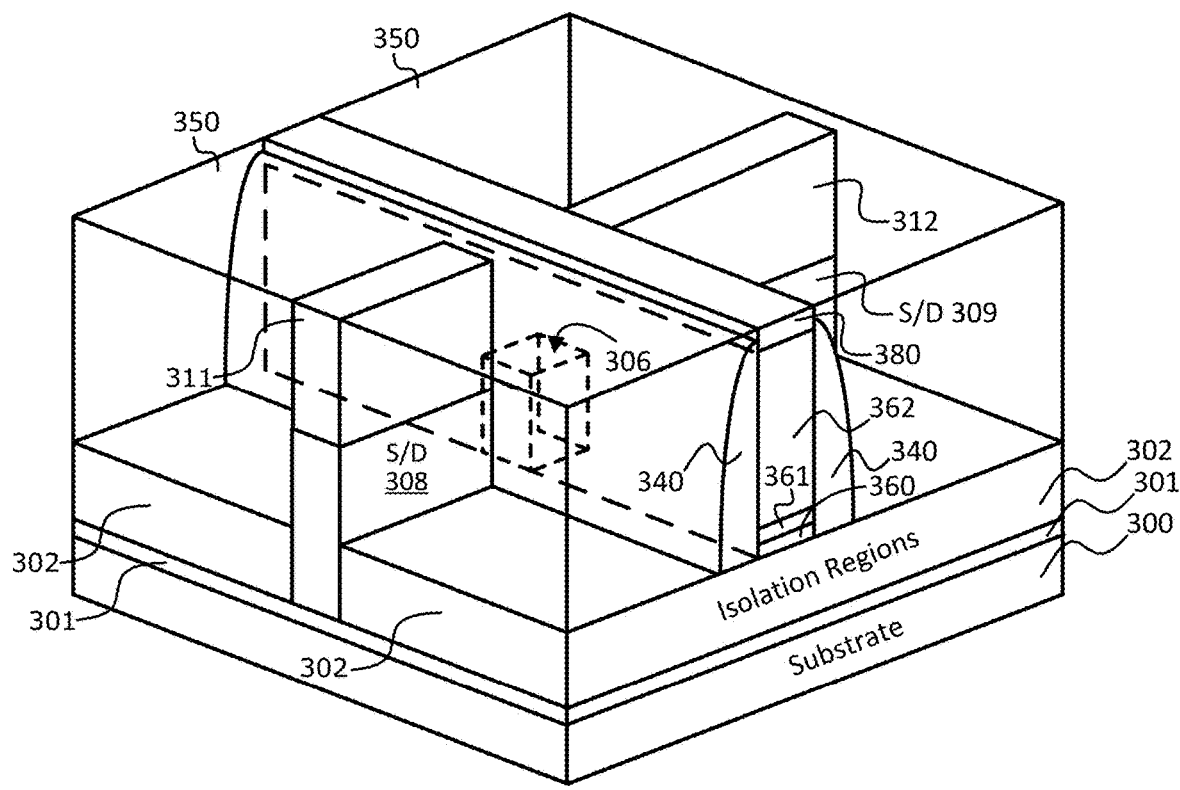
FIG. 3H illustrates a perspective view of the structure of FIG. 3G after additional processing to form semiconductor devices, in accordance with one or more embodiments.

With reference to FIG. 3H, gate electrode 362 was deposited/formed to replace dummy gate electrode 332 in this embodiment, and gate dielectric 360 is formed directly under gate electrode 362 to form 270 the gate stack. As can also be seen, spacers 340 are formed around the gate stack, and the gate stack also has hardmask 380 formed thereon (which may be removed to form a metal gate contact). The gate dielectric 360 may be formed using any suitable technique and from any suitable materials. The gate dielectric 360 can be, for example, any suitable oxide such as silicon dioxide ($SiO_2$) or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 360 to improve its quality when a high-k material is used. In some embodiments, additional processing may be performed on the high-k gate dielectric, such as an annealing process to improve the quality of the high-k material. In some embodiments, the gate dielectric 360 and/or gate electrode 362 may include a multilayer structure of two or more material layers or portions. For instance, a gate dielectric 360 structure may include a layer of silicon dioxide on the channel region 306 of the fin and a layer of hafnium oxide on the layer of silicon dioxide.

Figure 4A:
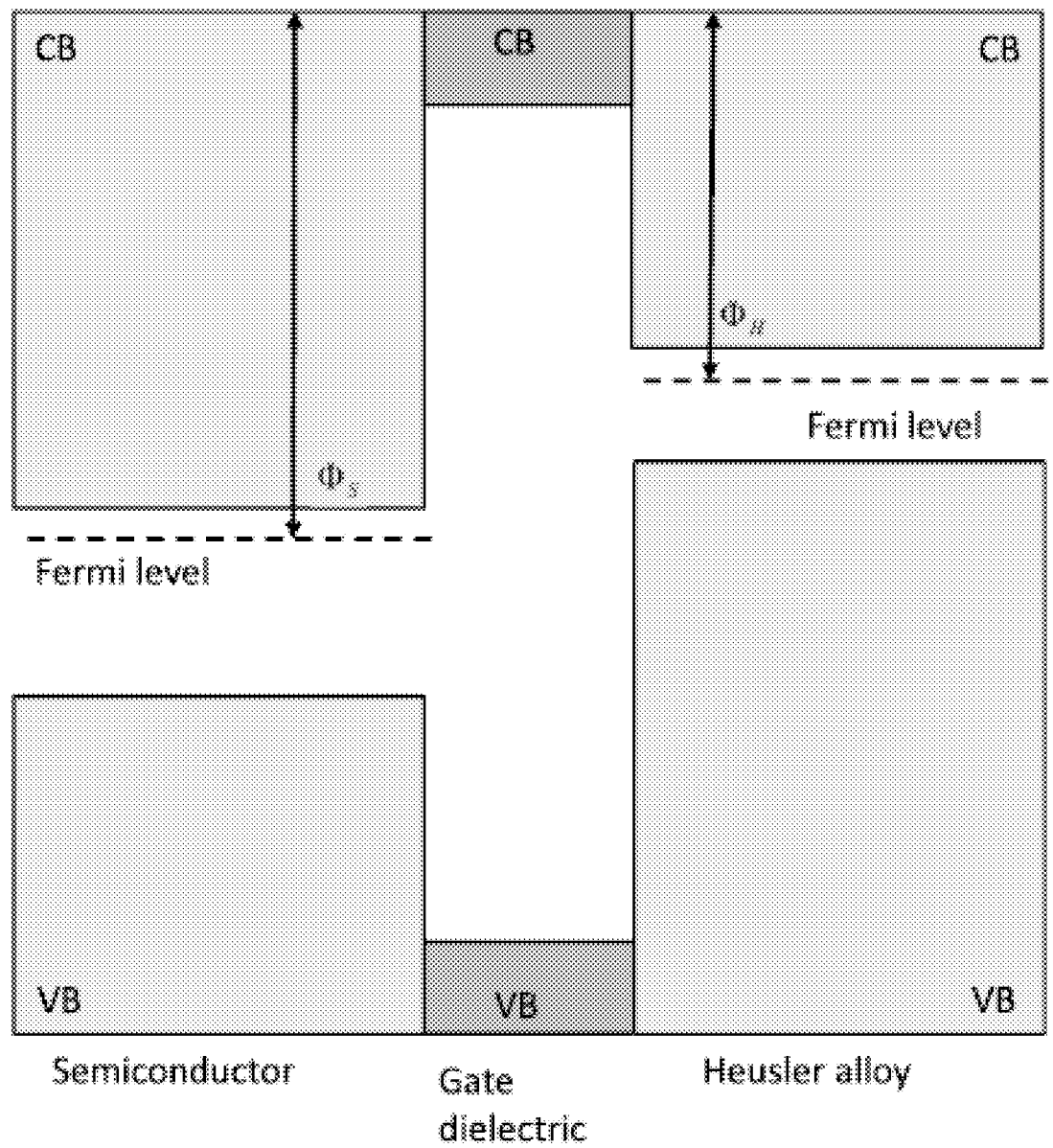
FIG. 4A illustrates a band diagram for an NMOS gate, in accordance with one or more embodiments.
Figure 4B:
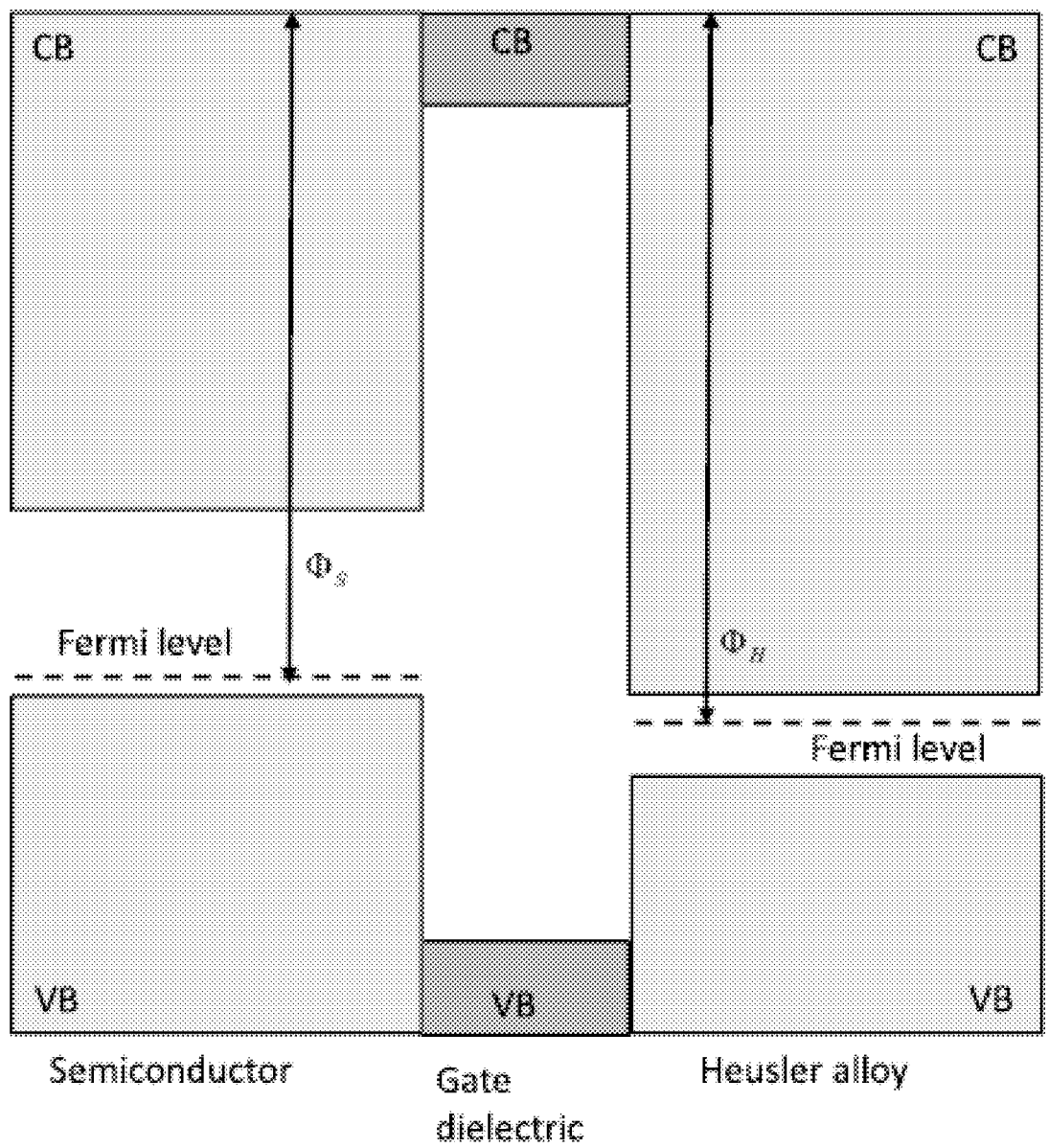
FIG. 4B illustrates a band diagram for a PMOS gate, in accordance with one or more embodiments.

In some embodiments, the gate electrode 362 comprises a first crystalline alloy including a transition metal, also denoted herein as a Heusler alloy. As a Heusler alloy is a ferromagnetic metal alloy, in some embodiments, the crystalline alloys including a transition metal variously described herein may also be considered a ferromagnetic metal alloy. In these embodiments, the gate electrode 362 is crystalline due to the presence of the first crystalline alloy. The first crystalline alloy can include at least one of a cobalt-iron-aluminum-silicon alloy ($Co_2FeSi$, $Co_2FeAl_xSi_{1-x}$, $0 \leq x \leq 1$), a cobalt-manganese-silicon alloy ($Co_2MnSi$), a cobalt-iron-silicon-germanium alloy ($Co_2FeSiGe$), a cobalt-chromium-iron-aluminum alloy ($Co_2CrFeAl$, $Co_2Cr_{0.5}Fe_{0.5}Al$), a cobalt-iron-germanium-gallium alloy ($Co_2FeGeGa$), a manganese-gallium alloy ($Mn_3Ga$), a manganese-germanium alloy ($Mn_3Ge$), a manganese-germanium-gallium alloy ($Mn_3GeGa$), or an iron-manganese-silicon alloy ($Fe_{3-x}Mn_xSi$, $0 \leq x \leq 1.5$). In other embodiments, the first crystalline alloy can include at least one of an M-manganese-germanium alloy ($M_2MnGe$), an M-manganese-gallium alloy ($M_2MnGa$), an M-manganese-aluminum alloy ($M_2MnAl$), an M-manganese-antimony alloy ($MMnSb$), or an M-manganese-indium alloy ($M_2MnIn$), where M is one of cobalt (Co), nickel (Ni), copper (Cu), rhodium (Rh), palladium (Pd), or platinum (Pt). As shown in FIG. 4A for an NMOS device, and in FIG. 4B for a PMOS device, the work function of the Heusler alloy is aligned with the work function of the channel semiconductor material such that a threshold voltage of the non-planar semiconductor device is in a range of between 0.2 V and 0.7 V, such as 0.3 V, 0.4 V, 0.5 V, or 0.6 V. The threshold voltage $V_T$ for an NMOS device is obtained from $$V_T = V_{FB} + \frac{\sqrt{2\varepsilon_s q N_B (2|\phi_F|)}}{C_{ox}} + 2|\phi_F| - \frac{Q_i}{C_{ox}} \quad (1)$$

and for a PMOS device from $$V_T = V_{FB} - \frac{\sqrt{2\varepsilon_s q N_B (2|\phi_F|)}}{C_{ox}} - 2|\phi_F| - \frac{Q_i}{C_{ox}} \quad (2)$$

where $$V_{FB} = \Phi_H - \Phi_S \quad (3)$$

and $$\phi_F = \frac{kT}{q} \log\left(\frac{N_B}{N_i}\right) \quad (4)$$

where $\phi_F$ is half the contact potential, k is the Boltzmann constant, T is the temperature, q is the absolute value of the charge of an electron, $N_B$ is the doping in the bulk of the channel, $N_i$ is the intrinsic carrier density of the semiconductor, $Q_i$ is the areal charge density of interface traps, $C_{ox}$ is the capacitance per unit area of the gate dielectric oxide, $\Phi_H$ is the work function of the metal (Heusler alloy), $\Phi_S$ is the work function of the semiconductor, and $\varepsilon_s$ is the dielectric constant of the semiconductor.

Figure 5:
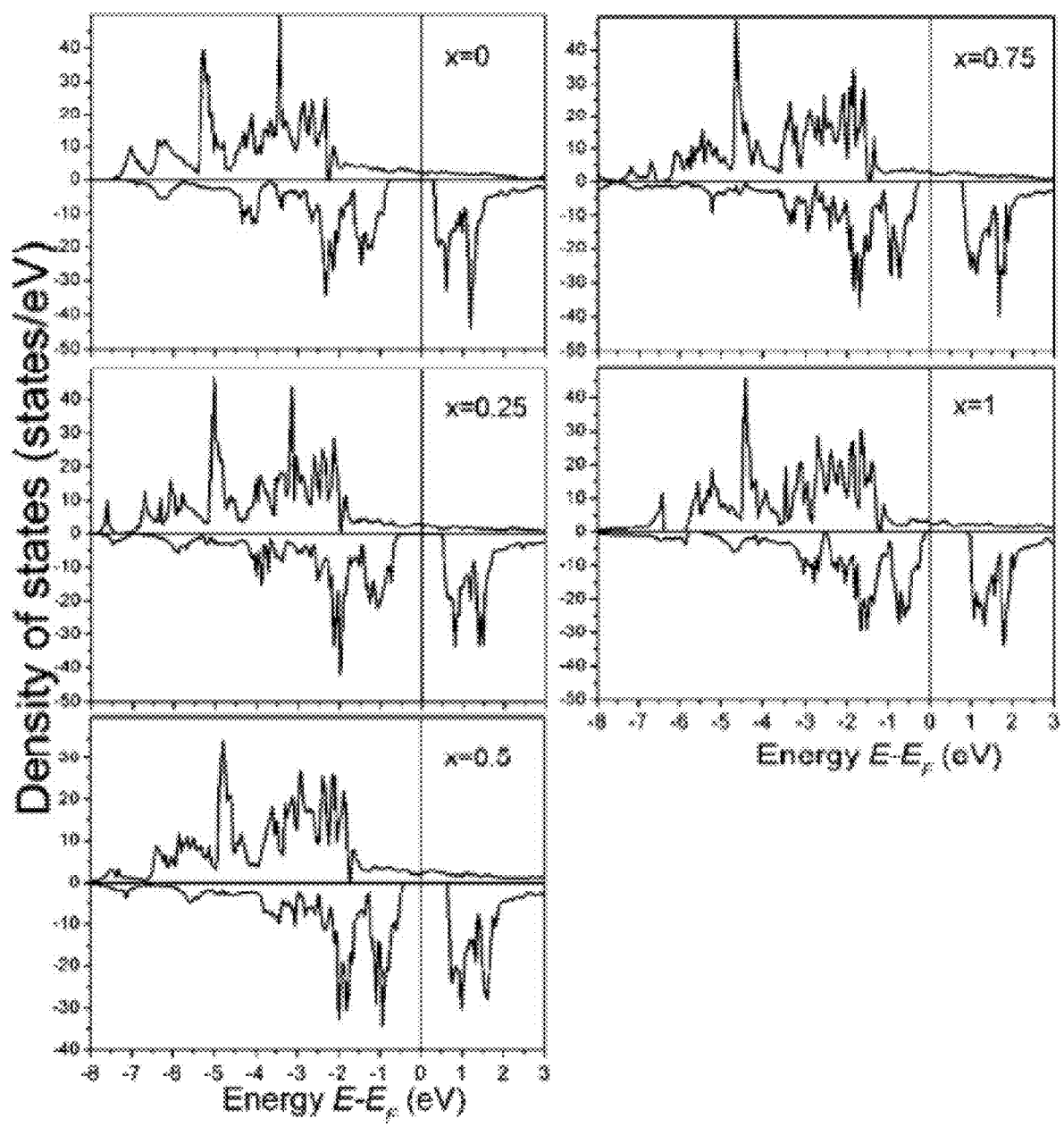
FIG. 5 illustrates the density of states (states/eV) as a function of energy (eV) for $Co_2FeAl_xSi_{1-x}$, $0 \leq x \leq 1$.

In a specific example embodiment, the first crystalline alloy is $Co_2FeAl_xSi_{1-x}$, $0 \leq x \leq 1$. As shown in FIG. 5, changing stoichiometry by changing the value of x shifts the Fermi level of the Heusler alloy by about 1 eV. The difference in valence electrons between Si and Al leads to a change in the relative position of the Fermi level in the minority gap. Shifting the Fermi level changes the work function of the gate electrode, thereby aligning the work function of the Heusler alloy with the work function of the channel semiconductor material. The shift by about 1 eV from x=0 (Si system) to x=1 (Al system), shown in FIG. 5, is a practical range between a p-type work function metal and an n-type work function metal, respectively.

In some embodiments, as shown in FIG. 3H, the gate stack includes a first layer 361 directly between the gate dielectric 360 and the gate electrode 362, the first layer 361 comprising at least one of magnesium oxide (MgO), magnesium aluminum oxide (MgAlO), strontium titanate (SrTiO$_3$), alumina (Al$_2$O$_3$), dysprosium scandium oxide (DyScO$_3$), niobium scandium oxide (NbScO$_3$), or niobium strontium titanate (NbSrTiO$_3$). In an example embodiment, the first layer 361 is magnesium oxide. The first layer 361 is a template promoting layer that is lattice matched to the first crystalline alloy. Lattice matching as used herein means that, in certain embodiments, the first layer 361 has a first lattice parameter and the first crystalline alloy has a second lattice parameter that is within +/−2%, such as within +/−1.5%, or within +/−1.0%, or within +/−0.5% of the first lattice parameter. In other embodiments, the first layer 361 has a first lattice parameter and the first crystalline alloy has a second lattice parameter that is within a tolerance of the first lattice parameter such that there is lattice continuity across the entire interface between the first layer 361 and the first crystalline alloy.

The gate electrode 362 comprising the first crystalline alloy can be formed using any of a wide variety of processes, including CVD, physical vapor deposition (PVD), atomic layer deposition (ALD), molecular beam epitaxy (MBE), and/or any combination thereof. In an example embodiment employing PVD at a base pressure of 1E-8 Torr or less, argon can be used as the sputtering gas at a pressure in a range of between 1 mTorr and 5 mTorr, with a sputtering target to wafer spacing greater than 10 mean free path lengths, at a substrate temperature in a range of between −150° C. and 600° C., followed by a post-deposition anneal at a temperature in a range of between 300° C. and 700° C. to form the crystalline Heusler phase. Numerous gate dielectric and gate electrode configurations can be used, as will be apparent. Other suitable configurations, materials, and processes for forming a replacement gate or replacement metal gate (RMG) will depend on a given application and will be apparent in light of this disclosure.

With further reference to FIG. 3H, an etching process (e.g., any suitable wet or dry etching process) was performed to expose the source/drain regions 308 and 309 of fin 310, as shown, and remove any native oxide. Method 200 to form an integrated circuit device then continues with forming 280 the source and drain contacts 311 and 312 on the source 308 and drain 309 regions, respectively. In some embodiments, the source and drain contacts 311/312 include a first and a second crystalline alloy, respectively. In these embodiments, the source and drain contacts 311/312 are crystalline due to the presence of the first and second crystalline alloys. The deposition and annealing conditions for the first and second crystalline alloys are the same as those discussed above for the first crystalline alloy, and will not be repeated for the sake of brevity.

Figure 6A:
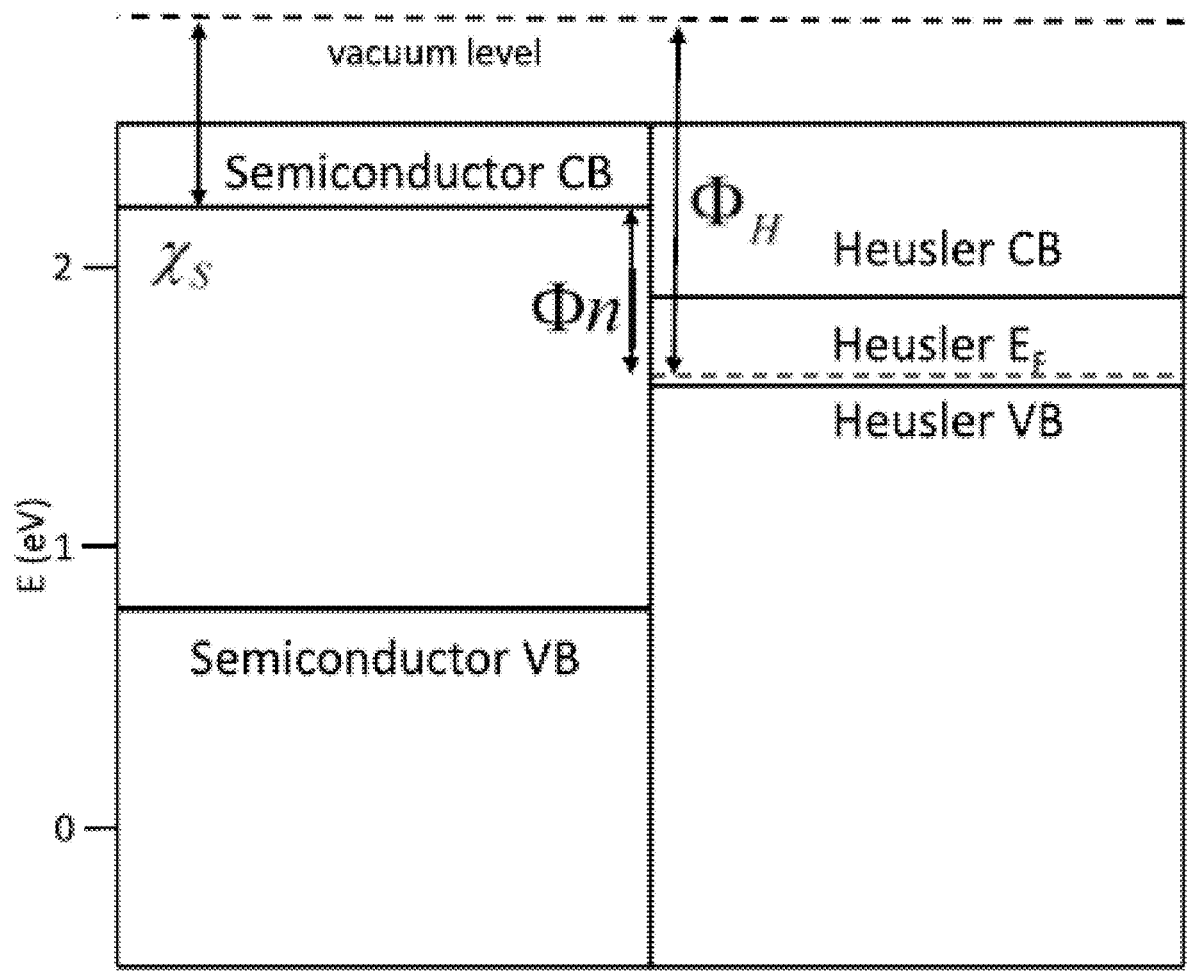
FIG. 6A illustrates a band diagram for p-doped source and drain regions, in accordance with one or more embodiments.
Figure 6B:
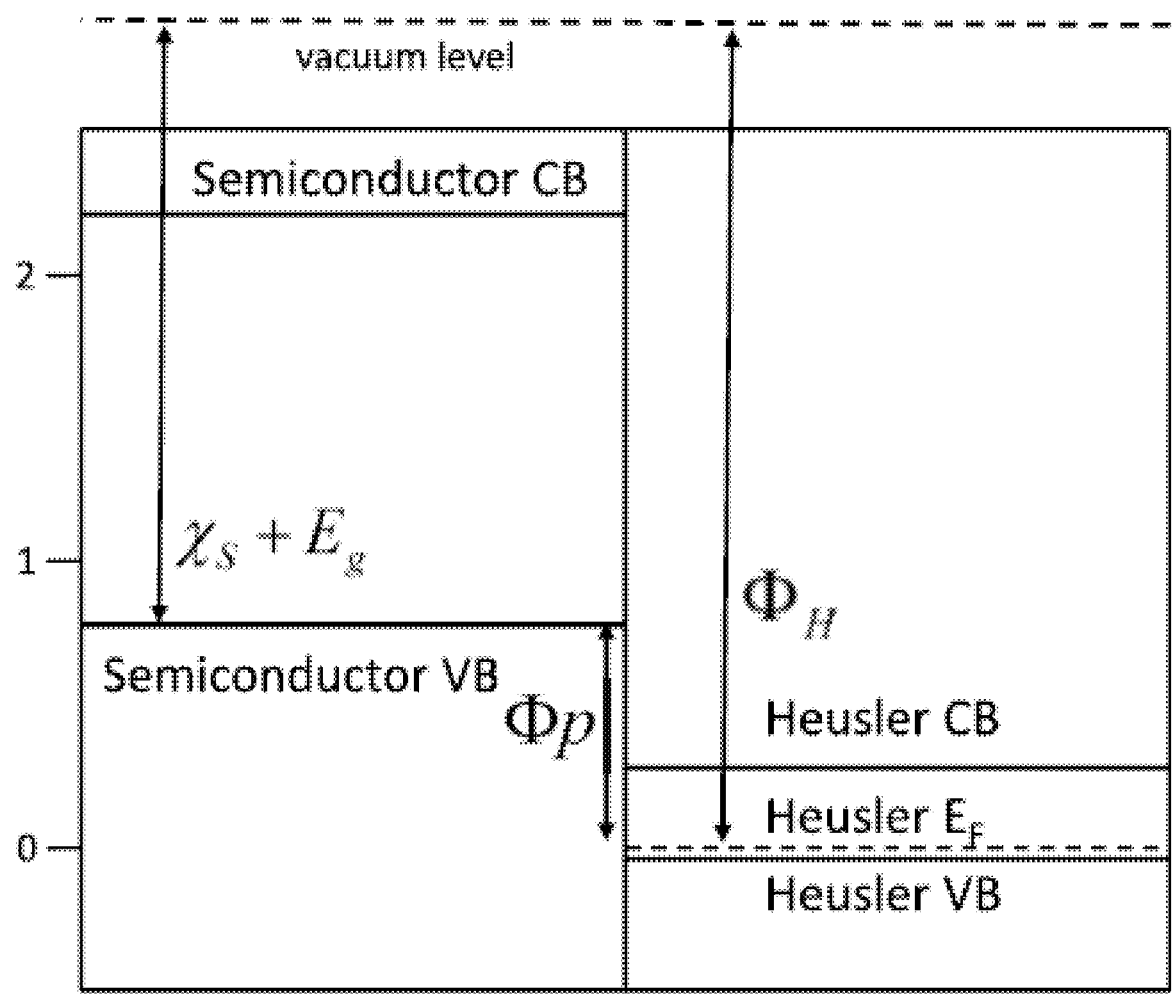
FIG. 6B illustrates a band diagram for n-doped source and drain regions, in accordance with one or more embodiments.

As shown in FIG. 6A for n-doped source 308 and drain 309 regions and in FIG. 6B for p-doped source 308 and drain 309 regions, the work function of the first crystalline alloy is aligned with the work function of the semiconductor material of the source region such that a Schottky barrier height $\Phi_n$ in FIG. 6A and $\Phi_p$ in FIG. 6B) associated with an interface between the first crystalline alloy and the source region is in a range of 0.3 eV or less, such as 0.2 eV, or 0.1 eV, or 0 eV, and the work function of the second crystalline alloy is aligned with the work function of the semiconductor material of the drain region such that a Schottky barrier height associated with an interface between the second crystalline alloy and the drain region is in a range of 0.3 eV or less, such as 0.2 eV, or 0.1 eV, or 0 eV. As shown in FIG. 6B, the Schottky barrier height $\Phi_p$ can be negative, such as −0.1 eV, or −0.2 eV, or −0.3 eV, or −0.4 eV, or −0.5 eV. An example embodiment of a negative Schottky barrier height is at an interface between GaAs and Co$_2$Cr$_{0.5}$Fe$_{0.5}$Al. Suitable alternatives for Schottky barrier heights may be at most 0.5 eV, or at most 0.4 eV, or at most 0.3 eV, or at most 0.2 eV, or at most 0.1 eV. In a first specific example embodiment, n-type source 308 and drain 309 regions are germanium with phosphorus or arsenic doping, and the source and drain contacts 311/312 are Co$_2$CoAl. In a second specific example embodiment, p-type source 308 and drain 309 regions are silicon with boron doping, and the source and drain contacts 311/312 are Ni$_2$VSi. In a third specific example embodiment, the channel, source, and drain regions are GaAs, and the crystalline alloy contacts are Co$_2$CrFeAl.

Figure 7:
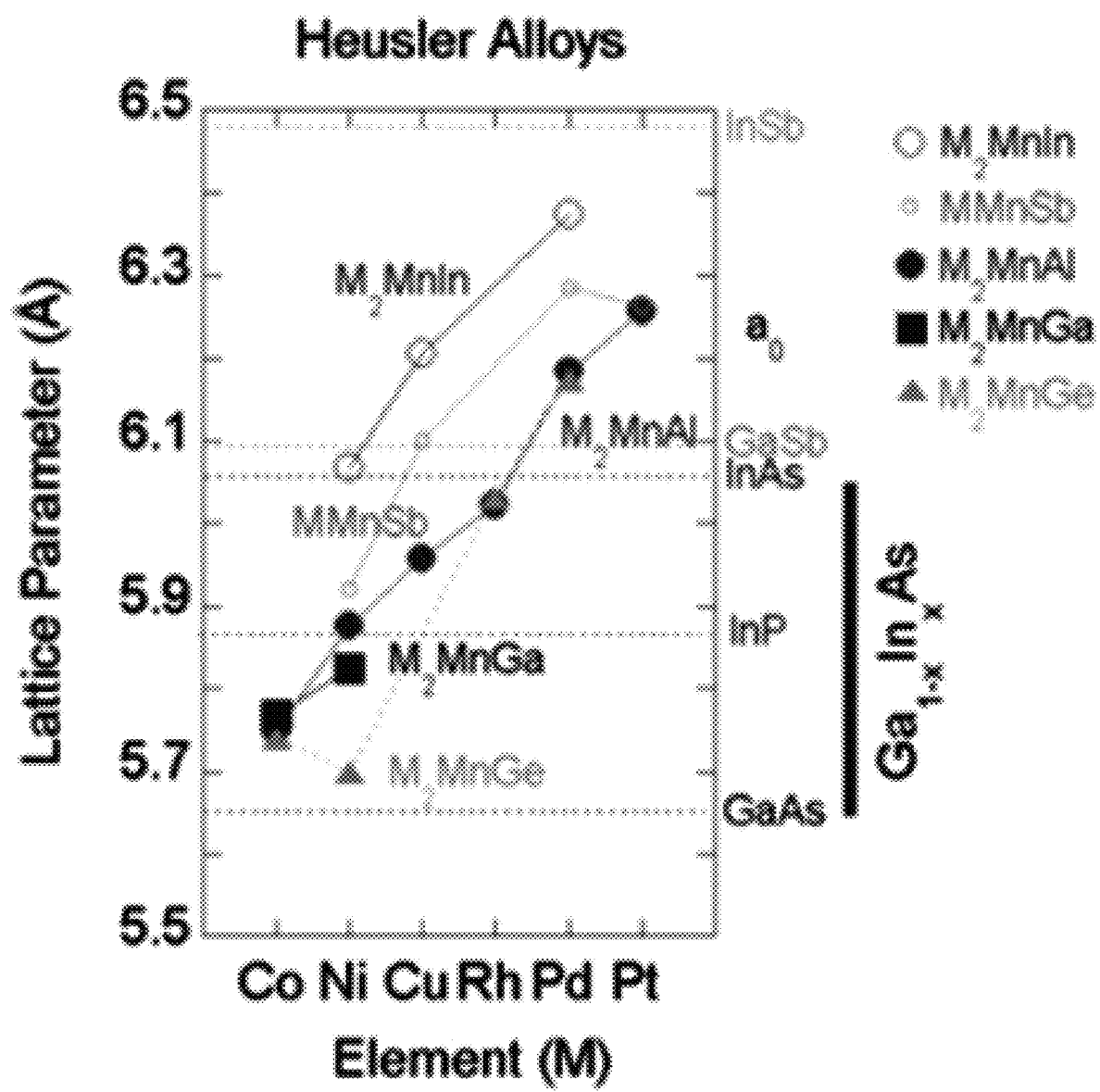
FIG. 7 illustrates lattice parameters for a class of manganese (Mn) based Heusler alloys.

In example embodiments, the first crystalline alloy is lattice matched to the source region, and the second crystalline alloy is lattice matched to the drain region. As shown in FIG. 7, manganese (Mn) based Heusler alloys can be lattice matched to group III-V semiconductor materials. For example, NiMnSb has a lattice parameter equal to slightly less than 6.1 Angstrom, and therefore is lattice matched to GaSb. As also shown in FIG. 7, several M$_2$MnGa, MMnSb, and M$_2$MnGe crystalline alloys (M is Co, Ni, Cu and Rh) can be lattice matched to Ga$_{1-x}$In$_x$As (0≤x≤1) or InP. An example near perfect lattice match is GaAs source, drain, and channel regions with respective contacts being Co$_2$MnSi, both GaAs and Co$_2$MnSi having the same lattice parameter of about 5.65 Angstrom. In another example embodiment, a Fe$_{3-x}$Mn$_x$Si 0≤x≤1.4) crystalline alloy can be lattice matched or templated to a Si (111) surface having a lattice parameter of 0.543 nm by tuning the value of x from a lattice parameter of 0.563 nm (x=0) to 0.5635 nm (x=0.6), 0.565 (x=1.0), and 0.567 nm (x=1.4).

In embodiments where a given source/drain contact does not include a Heusler alloy contact, the given S/D contact may include any other suitable metal or metal alloy, such as aluminum or tungsten, although any suitable conductive metal or metal alloy (or other suitable electrically conductive material) can be used, such as silver, nickel-platinum, or nickel-aluminum, for example. For instance, in some embodiments, only one of a source/drain contact pair may include a Heusler alloy, where the other of the source/drain contact pair does not include a Heusler alloy. In some embodiments, S/D contact formation may include silicidation, germanidation, III-V-idation, and/or annealing processes, where such processing may be performed, e.g., to form an intervening contact layer before forming the bulk contact metal structure. In some embodiments, one or more of the S/D contacts may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, S/D contacts may employ low work-function metal material(s) and/or high work-function metal material(s), depending on the particular configuration. In some embodiments, one or more additional layers may be present in the S/D contact regions, such as adhesion layers (e.g., titanium nitride) and/or liner or barrier layers (e.g., tantalum nitride), if so desired.

Figure 8:
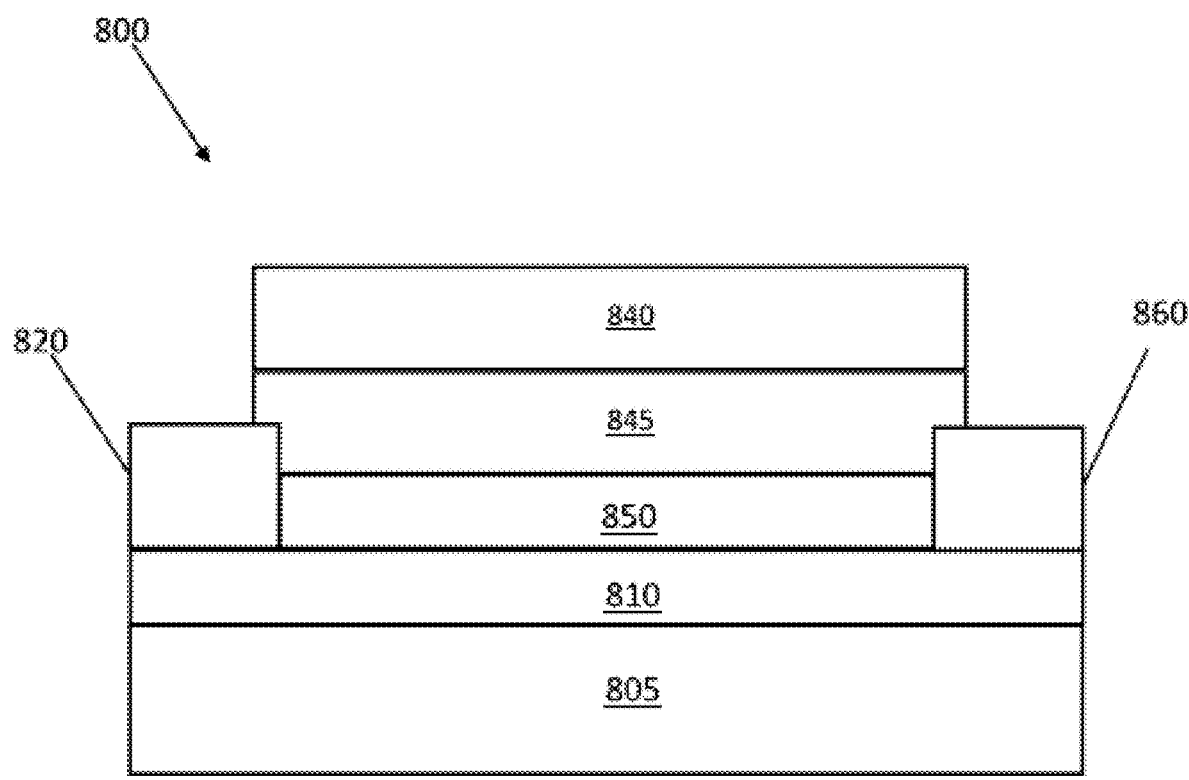
FIG. 8 illustrates a front cross-section view of a transistor device including source and drain contacts comprising crystalline alloys including a transition metal, in accordance with another embodiment.

In another embodiment, shown in FIG. 8, a transistor device, such as a PMOS or NMOS transistor 800 is formed on a substrate 805 and insulator 810 and includes a source contact 820, a gate dielectric 845, a gate electrode 840, a channel region 850 under the gate dielectric 845, and a drain contact 860. The three-dimensional channel region 850 includes 2D materials from the 2D metal di-chalcogenide family including $MX_2$, where M is molybdenum (Mo), tungsten (W), or titanium (Ti), and X is a chalcogenide, sulfur (S) or selenium (Se). The source contact 820 comprises the first crystalline alloy including a transition metal, and the drain contact 860 comprises the second crystalline alloy including a transition metal. The work functions of the first and second crystalline alloys are tuned by adjusting the alloy composition as described above to match the work function of the $MX_2$ channel region 850. The discussion above regarding the gate dielectric is equally applicable here as will be appreciated. The gate electrode 840 may comprise any of a wide range of materials, such as polysilicon or various suitable metals (e.g., aluminum (Al), tungsten (W), titanium (Ti), copper (Cu), or any other suitable metal or alloy). The gate electrode 840 may include a plug portion, one or more work function portions, a resistance reducing portion, and/or a liner portion. Numerous gate dielectric and gate electrode configurations can be used, as will be apparent.

As previously mentioned, method 200 and the structures shown in FIGS. 3A-3H are depicted and described herein in the context of finned transistor configurations (e.g., tri-gate or finFET) having one or more of source and drain contacts and gate electrodes comprising crystalline alloys including a transition metal, for ease of illustration. However, the principles and techniques as variously described herein may be used for forming other semiconductor devices and transistor configurations on a single substrate including, for example, dual-gate, gate-all-around (e.g., nanowire/nanoribbon), planar, and other suitable transistor configurations. Also recall that the structures described herein may be used for the formation of PMOS, NMOS, or CMOS devices, depending upon the particular configuration. Also note that in some embodiments, the channel region described herein is located within at least a portion of at least one feature or body of a transistor, where the at least one feature/body includes semiconductor material and the semiconductor material may optionally include corresponding impurities/dopant (e.g., such that the semiconductor material has a net doping type of n-type or p-type). In some such embodiments, the at least one feature/body may be fin shaped, nanowire shaped, nanoribbon shaped, a combination thereof, and/or any other suitable shape as can be understood based on this disclosure. In addition, that the location of the channel region is located within at least a portion of at least one feature/body may be determined based on other adjacent or proximate features of the transistor, such as the source region, drain region, and/or gate structure. Further note that in some such embodiments, the channel region may be generally considered a transport region through which charge carriers (e.g., electrons or holes) can move. Numerous variations and configurations will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); X-ray photoemission spectroscopy (XPS); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments of the present disclosure, such tools may indicate the presence of non-planar semiconductor devices with one or more of source and drain contacts and gate electrodes comprising crystalline alloys including a transition metal, as variously described herein.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Example System

Figure 9:
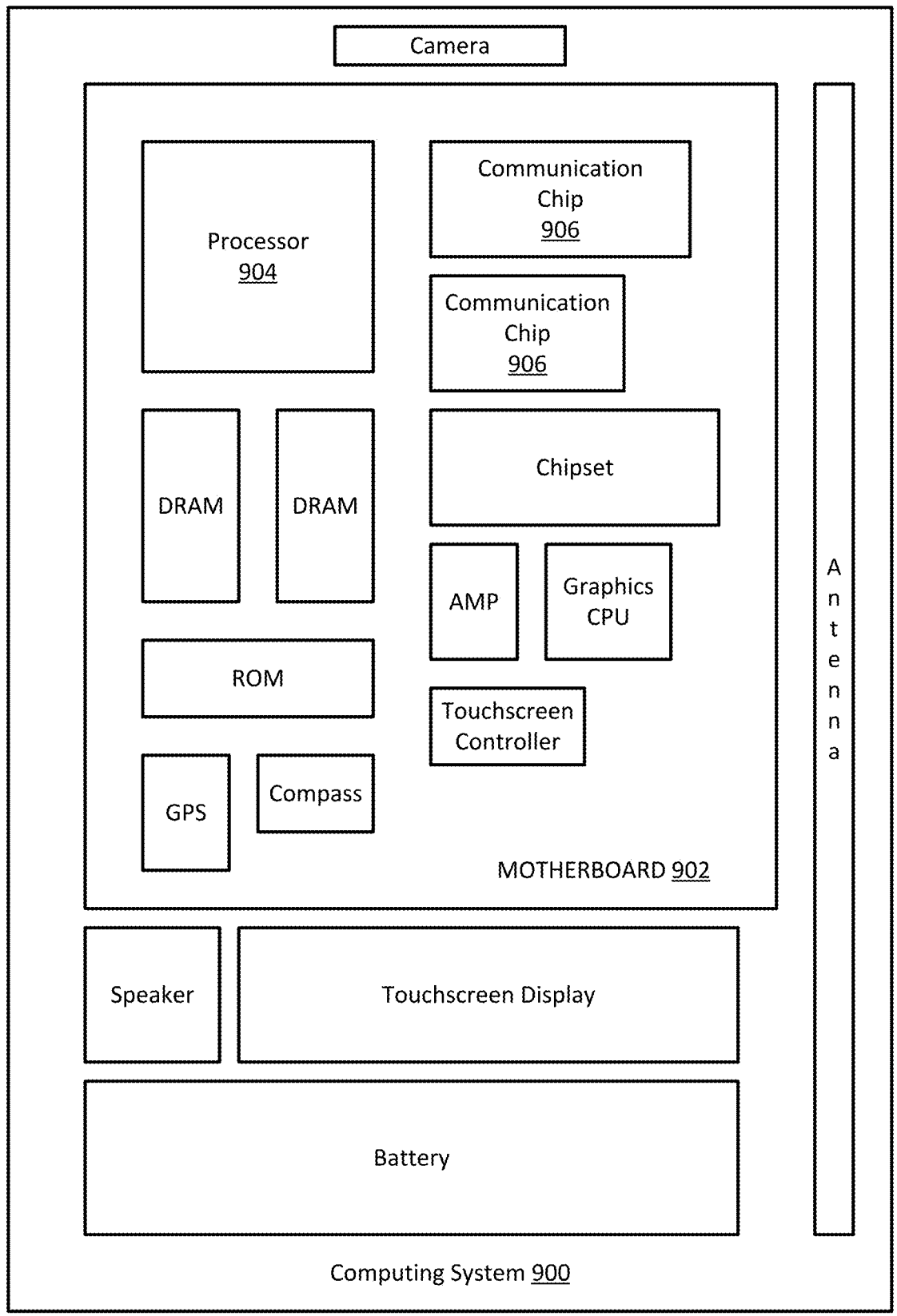
FIG. 9 is a depiction of a computing system configured according to an embodiment of this disclosure.

FIG. 9 is an example computing system implemented with one or more of the integrated circuit structures as disclosed herein, in accordance with some embodiments of the present disclosure. As can be seen, the computing system 900 houses a motherboard 902. The motherboard 902 may include a number of components, including, but not limited to, a processor 904 and at least one communication chip 906, each of which can be physically and electrically coupled to the motherboard 902, or otherwise integrated therein. As will be appreciated, the motherboard 902 may be, for example, any printed circuit board, whether a main board, a daughterboard mounted on a main board, or the only board of system 900, etc.

Depending on its applications, computing system 900 may include one or more other components that may or may not be physically and electrically coupled to the motherboard 902. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 900 may include one or more integrated circuit structures or devices configured in accordance with an example embodiment (e.g., to include one or more non-planar semiconductor devices with one or more of source and drain contacts and gate electrodes comprising crystalline alloys including a transition metal, as variously provided herein). In some embodiments, multiple functions can be integrated into one or more chips (e.g., for instance, note that the communication chip 906 can be part of or otherwise integrated into the processor 904).

The communication chip 906 enables wireless communications for the transfer of data to and from the computing system 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1× evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. The computing system 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others. In some embodiments, communication chip 906 may include one or more non-planar semiconductor devices with one or more of source and drain contacts and gate electrodes comprising crystalline alloys including a transition metal, as variously described herein.

The processor 904 of the computing system 900 includes an integrated circuit die packaged within the processor 904. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 906 also may include an integrated circuit die packaged within the communication chip 906. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 904 (e.g., where functionality of any chips 906 is integrated into processor 904, rather than having separate communication chips). Further note that processor 904 may be a chip set having such wireless capability. In short, any number of processor 904 and/or communication chips 906 can be used. Likewise, any one chip or chip set can have multiple functions integrated therein.

In various implementations, the computing system 900 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a non-planar semiconductor device, comprising: a three-dimensional channel region; a gate electrode at least above the three-dimensional channel region, the gate electrode comprising a first crystalline alloy including a transition metal; and a gate dielectric between the gate electrode and the three-dimensional channel region.

Example 2 includes the subject matter of Example 1, further including a source region adjacent the channel region; a source contact on the source region; a drain region adjacent the channel region; and a drain contact on the drain region.

Example 3 includes the subject matter of Example 1 or Example 2, wherein the three-dimensional channel region includes one of silicon (Si) or group III-V semiconductor material.

Example 4 includes the subject matter of any of Examples 1 to 3, wherein a work function of the first crystalline alloy is aligned with a work function of the three-dimensional channel region such that a threshold voltage of the non-planar semiconductor device is in a range of between 0.2 V and 0.7 V.

Example 5 includes the subject matter of any of Examples 1 to 4, wherein the first crystalline alloy includes at least one of a cobalt-iron-aluminum-silicon alloy ($Co_2FeSi$, $Co_2FeAl_xSi_{1-x}$, $0 \leq x \leq 1$), a cobalt-manganese-silicon alloy ($Co_2MnSi$), a cobalt-iron-silicon-germanium alloy ($Co_2FeSiGe$), a cobalt-chromium-iron-aluminum alloy ($Co_2CrFeAl$, $Co_2Cr_{0.5}Fe_{0.5}Al$), a cobalt-iron-germanium-gallium alloy ($Co_2FeGeGa$), a manganese-gallium alloy ($Mn_3Ga$), a manganese-germanium alloy ($Mn_3Ge$), a manganese-germanium-gallium alloy ($Mn_3GeGa$), or an iron-manganese-silicon alloy ($Fe_{3-x}Mn_xSi$, $0 \leq x \leq 1.5$).

Example 6 includes the subject matter of any of Examples 1 to 4, wherein the first crystalline alloy includes at least one of an M-manganese-germanium alloy ($M_2MnGe$), an M-manganese-gallium alloy ($M_2MnGa$), an M-manganese-aluminum alloy ($M_2MnAl$), an M-manganese-antimony alloy ($MMnSb$), or an M-manganese-indium alloy ($M_2MnIn$), where M is one of cobalt (Co), nickel (Ni), copper (Cu), rhodium (Rh), palladium (Pd), or platinum (Pt).

Example 7 includes the subject matter of any of Examples 1 to 6, further including a first layer directly between the gate dielectric and the gate electrode, the first layer comprising at least one of magnesium oxide (MgO), magnesium aluminum oxide (MgAlO), strontium titanate ($SrTiO_3$), alumina ($Al_2O_3$), dysprosium scandium oxide ($DyScO_3$), niobium scandium oxide ($NbScO_3$), or niobium strontium titanate ($NbSrTiO_3$).

Example 8 includes the subject matter of Example 7, wherein the first layer is lattice matched to the first crystalline alloy.

Example 9 includes the subject matter of Examples 7 or 8, wherein the first layer has a first lattice parameter and the first crystalline alloy has a second lattice parameter that is within +/−2% of the first lattice parameter.

Example 10 includes the subject matter of any of Examples 7 to 9, wherein the first layer has a first lattice parameter and the first crystalline alloy has a second lattice parameter that is within a tolerance of the first lattice parameter such that there is lattice continuity across the entire interface between the first layer and the first crystalline alloy.

Example 11 is a method for forming a transistor, the method comprising: forming a three-dimensional channel region; forming a gate electrode at least above the three-dimensional channel region, the gate electrode comprising a first crystalline alloy including a transition metal; and forming a gate dielectric between the gate electrode and the three-dimensional channel region.

Example 12 includes the subject matter of Example 11, further including forming a source region adjacent the channel region; forming a source contact on the source region; forming a drain region adjacent the channel region; and forming a drain contact on the drain region.

Example 13 includes the subject matter of Example 11 or Example 12, further including aligning a work function of the first crystalline alloy with a work function of the three-dimensional channel region such that a threshold voltage of the non-planar semiconductor device is in a range of between 0.2 V and 0.7 V.

Example 14 is a non-planar semiconductor device comprising: a three-dimensional channel region; a source region adjacent the channel region; and a source contact on the source region, the source contact comprising a first crystalline alloy including a transition metal.

Example 15 includes the subject matter of Example 14, further including a gate electrode at least above the three-dimensional channel region; and a gate dielectric between the gate electrode and the three-dimensional channel region.

Example 16 includes the subject matter of Example 14 or Example 15, further including a drain region adjacent the channel region; and a drain contact on the drain region, the drain contact comprising a second crystalline alloy including a transition metal.

Example 17 includes the subject matter of any of Examples 14 to 16, wherein the three-dimensional channel region includes $MX_2$, where M is molybdenum (Mo), tungsten (W), or titanium (Ti), and X is sulfur (S) or selenium (Se).

Example 18 includes the subject matter of any of Examples 14 to 17, wherein the first crystalline alloy is lattice matched to the source region.

Example 19 includes the subject matter of any of Examples 14 to 18, wherein the first crystalline alloy has a first lattice parameter and the source region has a second lattice parameter that is within +/−2% of the first lattice parameter.

Example 20 includes the subject matter of any of Examples 14 to 19, wherein the first crystalline alloy has a first lattice parameter and the source region has a second lattice parameter that is within a tolerance of the first lattice parameter such that there is lattice continuity across the entire interface between the first crystalline alloy and the source region.

Example 21 includes the subject matter of any of Examples 14 to 20, wherein a work function of the first crystalline alloy is aligned with a work function of the source region such that a Schottky barrier height associated with an interface between the first crystalline alloy and the source region is in a range of 0.3 eV or less.

Example 22 includes the subject matter of any of Examples 14 to 21, wherein the first crystalline alloy includes at least one of a cobalt-iron-aluminum-silicon alloy ($Co_2FeSi$, $Co_2FeAl_xSi_{1-x}$, $0 \leq x \leq 1$), a cobalt-manganese-silicon alloy ($Co_2MnSi$), a cobalt-iron-silicon-germanium alloy ($Co_2FeSiGe$), a cobalt-chromium-iron-aluminum alloy ($Co_2CrFeAl$, $Co_2Cr_{0.5}Fe_{0.5}Al$), a cobalt-iron-germanium-gallium alloy ($Co_2FeGeGa$), a manganese-gallium alloy ($Mn_3Ga$), a manganese-germanium alloy ($Mn_3Ge$), a manganese-germanium-gallium alloy ($Mn_3GeGa$), or an iron-manganese-silicon alloy ($Fe_{3-x}Mn_xSi$, $0 \leq x \leq 1.5$).

Example 23 includes the subject matter of any of Examples 14 to 21, wherein the first crystalline alloy includes at least one of an M-manganese-germanium alloy ($M_2MnGe$), an M-manganese-gallium alloy ($M_2MnGa$), an M-manganese-aluminum alloy ($M_2MnAl$), an M-manganese-antimony alloy (MMnSb), or an M-manganese-indium alloy ($M_2MnIn$), where M is one of Co, Ni, Cu, Rh, Pd, or Pt.

Example 24 includes the subject matter of any of Examples 16 to 23, wherein the second crystalline alloy is lattice matched to the drain region.

Example 25 includes the subject matter of any of Examples 16 to 24, wherein the second crystalline alloy has a third lattice parameter and the drain region has a fourth lattice parameter that is within +/−2% of the third lattice parameter.

Example 26 includes the subject matter of any of Examples 16 to 25, wherein the second crystalline alloy has a third lattice parameter and the drain region has a fourth lattice parameter that is within a tolerance of the third lattice parameter such that there is lattice continuity across the entire interface between the second crystalline alloy and the drain region.

Example 27 includes the subject matter of any of Examples 16 to 26, wherein a work function of the second crystalline alloy is aligned with a work function of the drain region such that a Schottky barrier height associated with an interface between the second crystalline alloy and the drain region is in a range of 0.3 eV or less.

Example 28 includes the subject matter of any of Examples 16 to 27, wherein the second crystalline alloy includes at least one of a cobalt-iron-aluminum-silicon alloy ($Co_2FeSi$, $Co_2FeAl_xSi_{1-x}$, $0 \leq x \leq 1$), a cobalt-manganese-silicon alloy ($Co_2MnSi$), a cobalt-iron-silicon-germanium alloy ($Co_2FeSiGe$), a cobalt-chromium-iron-aluminum alloy ($Co_2CrFeAl$, $Co_2Cr_{0.5}Fe_{0.5}Al$), a cobalt-iron-germanium-gallium alloy ($Co_2FeGeGa$), a manganese-gallium alloy ($Mn_3Ga$), a manganese-germanium alloy ($Mn_3Ge$), a manganese-germanium-gallium alloy ($Mn_3GeGa$), or an iron-manganese-silicon alloy ($Fe_{3-x}Mn_xSi$, $0 \leq x \leq 1.5$).

Example 29 includes the subject matter of any of Examples 16 to 27, wherein the second crystalline alloy includes at least one of an M-manganese-germanium alloy ($M_2MnGe$), an M-manganese-gallium alloy ($M_2MnGa$), an M-manganese-aluminum alloy ($M_2MnAl$), an M-manganese-antimony alloy (MMnSb), or an M-manganese-indium alloy ($M_2MnIn$), where M is one of Co, Ni, Cu, Rh, Pd, or Pt.

Example 30 is a method of forming a non-planar semiconductor device, the method comprising: forming a three-dimensional channel region; forming a source region adjacent the channel region; and forming a source contact on the source region, the source contact comprising a first crystalline alloy including a transition metal.

Example 31 includes the subject matter of Example 30, further including forming a gate electrode at least above the three-dimensional channel region; and forming a gate dielectric between the gate electrode and the three-dimensional channel region.

Example 32 includes the subject matter of Example 30 or Example 31, further including forming a drain region adjacent the channel region; and forming a drain contact on the drain region, the drain contact comprising a second crystalline alloy including a transition metal.

Example 33 includes the subject matter of any of Examples 30 to 32, further including aligning a work function of the first crystalline alloy with a work function of the source region such that a Schottky barrier height associated with an interface between the first crystalline alloy and the source region is in a range of 0.3 eV or less.

Example 34 includes the subject matter of Example 32 or Example 33, further including aligning a work function of the second crystalline alloy with a work function of the drain region such that a Schottky barrier height associated with an interface between the second crystalline alloy and the drain region is in a range of 0.3 eV or less.

Example 35 includes a computing device or system that includes the subject matter of any of Examples 1 to 10 or 14 to 29.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor device, comprising:
a body comprising semiconductor material;
a gate electrode at least above the body, the gate electrode comprising a crystalline alloy including a transition metal;
a gate dielectric between the gate electrode and the body; and
a layer directly between the gate dielectric and the gate electrode, wherein the layer is lattice matched to crystalline alloy.

2. The semiconductor device of claim 1, further including a source region adjacent the body, a source contact on the source region, a drain region adjacent the body, and a drain contact on the drain region.

3. The semiconductor device of claim 1, wherein a work function of the crystalline alloy is aligned with a work function of the body such that a threshold voltage of the semiconductor device is in a range between 0.2 V and 0.7 V.

4. The semiconductor device of claim 1, wherein the crystalline alloy includes one or more of a cobalt-iron-aluminum-silicon alloy ($Co_2FeSi$, $Co_2FeAl_xSi_{1-x}$, $0 \leq x \leq 1$), a cobalt-manganese-silicon alloy ($Co_2MnSi$), a cobalt-iron-silicon-germanium alloy ($Co_2FeSiGe$), a cobalt-chromium-iron-aluminum alloy ($Co_2CrFeAl$, $Co_2Cr_{0.5}Fe_{0.5}Al$), a cobalt-iron-germanium-gallium alloy ($Co_2FeGeGa$), a manganese-gallium alloy ($Mn_3Ga$), a manganese-germanium alloy ($Mn_3Ge$), a manganese-germanium-gallium alloy ($Mn_3GeGa$), or an iron-manganese-silicon alloy ($Fe_{3-x}Mn_xSi$, $0 \leq x \leq 1.5$).

5. The semiconductor device of claim 1, wherein the crystalline alloy includes one or more of an M-manganese-germanium alloy ($M_2MnGe$), an M-manganese-gallium alloy ($M_2MnGa$), an M-manganese-aluminum alloy ($M_2MnAl$), an M-manganese-antimony alloy (MMnSb), or an M-manganese-indium alloy ($M_2MnIn$), where M is one of cobalt (Co), nickel (Ni), copper (Cu), rhodium (Rh), palladium (Pd), or platinum (Pt).

6. The semiconductor device of claim 1, wherein the layer directly between the gate dielectric and the gate electrode comprises one or more of magnesium oxide (MgO), magnesium aluminum oxide (MgAlO), strontium titanate ($SrTiO_3$), alumina ($Al_2O_3$), dysprosium scandium oxide ($DyScO_3$), niobium scandium oxide ($NbScO_3$), or niobium strontium titanate ($NbSrTiO_3$).

7. The semiconductor device of claim 1, wherein the layer has a first lattice parameter and the crystalline alloy has a second lattice parameter that is within +/-2% of the first lattice parameter.

8. The semiconductor device of claim 1, wherein the layer has a first lattice parameter and the crystalline alloy has a second lattice parameter that is within a tolerance of the first lattice parameter such that there is lattice continuity across the entire interface between the layer and the crystalline alloy.

9. A semiconductor device comprising:
a body comprising semiconductor material;
a source or drain region adjacent the body; and
a source or drain contact on the source or drain region, the source or drain contact comprising a crystalline alloy including a transition metal, wherein the crystalline alloy is lattice matched to the source or drain region.

10. The semiconductor device of claim 9, further including a gate electrode at least above the body, and a gate dielectric between the gate electrode and the body.

11. The semiconductor device of claim 10, wherein the crystalline alloy is a first crystalline alloy, the semiconductor device further including a second source or drain region adjacent the body, and a second source or drain contact on the second source or drain region, the second source or drain contact comprising a second crystalline alloy including a transition metal.

12. The semiconductor device of claim 9, wherein the body includes $MX_2$, where M is molybdenum (Mo), tungsten (W), or titanium (Ti), and X is sulfur (S) or selenium (Se).

13. The semiconductor device of claim 9, wherein the crystalline alloy has a first lattice parameter and the source region has a second lattice parameter that is within +/-2% of the first lattice parameter.

14. The semiconductor device of claim 9, wherein the crystalline alloy has a first lattice parameter and the source or drain region has a second lattice parameter that is within a tolerance of the first lattice parameter such that there is lattice continuity across the entire interface between the crystalline alloy and the source or drain region.

15. The semiconductor device of claim 9, wherein a work function of the crystalline alloy is aligned with a work function of the source or drain region such that a Schottky barrier height associated with an interface between the crystalline alloy and the source or drain region is 0.3 eV or less.

16. The semiconductor device of claim 11, wherein the second crystalline alloy is lattice matched to the second source or drain region.

17. The semiconductor device of claim 11, wherein a work function of the second crystalline alloy is aligned with a work function of the second source or drain region such that a Schottky barrier height associated with an interface between the second crystalline alloy and the second source or drain region is 0.3 eV or less.

18. A semiconductor device, comprising:

a body comprising semiconductor material;

a gate electrode at least above the body, the gate electrode comprising a crystalline alloy including a transition metal, wherein the crystalline alloy includes one or more of a cobalt-iron-aluminum-silicon alloy ($Co_2FeSi$, $Co_2FeAl_xSi_{1-x}$, $0 \leq x \leq 1$), a cobalt-manganese-silicon alloy ($Co_2MnSi$), a cobalt-iron-silicon-germanium alloy ($Co_2FeSiGe$), a cobalt-chromium-iron-aluminum alloy ($Co_2CrFeAl$, $Co_2Cr_{0.5}Fe_{0.5}Al$), a cobalt-iron-germanium-gallium alloy ($Co_2FeGeGa$), a manganese-gallium alloy ($Mn_3Ga$), a manganese-germanium alloy ($Mn_3Ge$), a manganese-germanium-gallium alloy ($Mn_3GeGa$), or an iron-manganese-silicon alloy ($Fe_{3-x}Mn_xSi$, $0 \leq x \leq 1.5$); and a gate dielectric between the gate electrode and the body.

19. A semiconductor device, comprising:

a body comprising semiconductor material;

a gate electrode at least above the body, the gate electrode comprising a crystalline alloy including a transition metal, wherein the crystalline alloy includes one or more of an M-manganese-germanium alloy ($M_2MnGe$), an M-manganese-gallium alloy ($M_2MnGa$), an M-manganese-aluminum alloy ($M_2MnAl$), an M-manganese-antimony alloy (MMnSb), or an M-manganese-indium alloy ($M_2MnIn$), where M is one of cobalt (Co), nickel (Ni), copper (Cu), rhodium (Rh), palladium (Pd), or platinum (Pt); and a gate dielectric between the gate electrode and the body.

* * * * *